United States Patent
Kishimoto et al.

(10) Patent No.: US 8,484,528 B2
(45) Date of Patent: Jul. 9, 2013

(54) RECEIVING APPARATUS, RECEIVING METHOD AND PROGRAM, AND RECEIVING SYSTEM

(75) Inventors: Naomichi Kishimoto, Kanagawa (JP); Hideyuki Matsumoto, Tokyo (JP); Toshiyuki Miyauchi, Kanagawa (JP); Yuichi Mizutani, Tokyo (JP)

(73) Assignee: Sony Corporation, Tokyo (JP)

( * ) Notice: Subject to any disclaimer, the term of this patent is extended or adjusted under 35 U.S.C. 154(b) by 542 days.

(21) Appl. No.: 12/783,120

(22) Filed: May 19, 2010

(65) Prior Publication Data

US 2010/0306615 A1   Dec. 2, 2010

(30) Foreign Application Priority Data

May 29, 2009   (JP) ............................... P2009-131258

(51) Int. Cl.
*H03M 13/00*   (2006.01)
(52) U.S. Cl.
USPC ............................ 714/758; 714/762; 714/801
(58) Field of Classification Search
None
See application file for complete search history.

(56) References Cited

U.S. PATENT DOCUMENTS

| | | | | |
|---|---|---|---|---|
| 7,325,174 B2* | 1/2008 | Choi et al. | | 714/704 |
| 2006/0047857 A1* | 3/2006 | Dabiri et al. | | 709/250 |
| 2006/0245384 A1* | 11/2006 | Talukdar et al. | | 370/310 |
| 2007/0113149 A1* | 5/2007 | Krafft et al. | | 714/760 |
| 2008/0301477 A1* | 12/2008 | Gade et al. | | 713/320 |
| 2009/0049362 A1 | 2/2009 | Mudulodu et al. | | |
| 2009/0094470 A1* | 4/2009 | Gao et al. | | 713/320 |
| 2011/0035647 A1* | 2/2011 | Eidson et al. | | 714/780 |
| 2011/0055643 A1* | 3/2011 | Kim et al. | | 714/704 |

FOREIGN PATENT DOCUMENTS

| | | |
|---|---|---|
| JP | 2007-81640 | 3/2007 |
| JP | 2008-544692 | 12/2008 |
| JP | 2009-38707 | 2/2009 |

OTHER PUBLICATIONS

English-language Extended European Search Report in counterpart EP 10 00 4876, mailed Oct. 1, 2012.

Weihuang Wang, et al., "Minimum-Energy LDPC Decoder for Real-Time Mobile Application", Design, Automation & Test in Europe Conference & Exhibition, 2007, IEEE, pp. 1-6, 2007.

Daewon, Lee, et al. "A Hybrid ARQ Scheme Using Packet Error Prediction On OFDM Based HSDPA Systems", $16^{th}$ $1^{st}$ Mobile and Wireless Communication Summit, 2007 IEEE, pp. 1-5, 2007.

* cited by examiner

*Primary Examiner* — Ajay Bhatia
*Assistant Examiner* — Daniel McMahon
(74) *Attorney, Agent, or Firm* — Sherr & Jiang, PLLC

(57) ABSTRACT

Disclosed herein is a receiving apparatus, including: a decoding section configured to receive and decode a low density parity check code; and a decoding control section configured to control a frequency of the decoding on the basis of conditional information that is an index indicative of a communication condition that influences power consumption in the decoding section.

14 Claims, 23 Drawing Sheets

--Prior Art--

RECEIVING APPARATUS, RECEIVING METHOD AND PROGRAM, AND RECEIVING SYSTEM

BACKGROUND OF THE INVENTION

1. Field of the Invention

The present invention relates to a receiving apparatus, a receiving method and program, and a receiving system and, more particularly, to a receiving apparatus, a receiving method and program, and a receiving system that are configured to reduce the power consumption in bad conditions while normally decoding LDPC (Low Density Parity Check) codes in good conditions.

2. Description of the Related Art

Having strong error correction capabilities, LDPC codes are employed the DVB-S2 (Digital Video Broadcasting—Satellite—Second Generation) standard and the DVB-T2 (Digital Video Broadcasting-Terrestrial 2) standard for use in digital television systems based on these broadcasting standards for example.

An LDPC code is repetitively decoded to provide high error correction capabilities. However, the repetition of decoding results in increasing the power consumption of digital television systems. Besides, the data amount per code word of LLR (Log-Likelihood Ratio) that is entered in a reception apparatus as an LDPC code depends on a symbol rate and so on. Consequently, the number of repetitions of decoding that can be executed in a given period of time varies. Further, if there is a variation in the data amount per code word of LDPC code, a deviation occurs in the timing of decoding, thereby causing a large variation in power consumption.

Now, referring to FIG. 1, there is shown a block diagram illustrating a receiving apparatus configured to receive LDPC codes.

A receiving apparatus 10 shown in FIG. 1 is composed of an LDPC decoding block 11 and a repetition count control block 12.

The LDPC decode block 11 receives a log-likelihood ratio as an LDPC code for each frame entered from the outside in response to a decode enable signal for enabling the reception of LLR supplied from the repetition count control block 12. The LDPC decode block 11 executes LDPC decoding by use of the received log-likelihood ratio. The LDPC decode block 11 determines on the basis of a decoding result whether the LDPC decoding has been successful or not. Then, depending on the determination result, the LDPC decode block 11 supplies a decode successful flag indicative of successful LDPC decoding or a decode unsuccessful flag indicative of unsuccessful LDPC decoding to the repetition count control block 12. In addition, as specified by the repetition count control block 12, the LDPC decode block 11 outputs a decode result.

A frame start signal indicative of a frame start timing is entered in the repetition count control block 12. In response to the frame start signal, the repetition count control block 12 enters a decode enable signal into the LDPC decode block 11. It should be noted that, if the level of a decode enable signal is H (High) level, the reception of log-likelihood ratio is enabled; if the level of a decode enable signal is L (Low) level, the reception of log-likelihood ratio is disabled.

If a decode successful flag is supplied from the LDPC decode block 11, the repetition count control block 12 instructs the LDPC decode block 11 to output the decoding result. On the other hand, if a decode unsuccessful signal is supplied from the LDPC decode block 11, the repetition count control block 12 instructs the LDPC decode block 11 to executing decoding again before the frame start signal of a next frame is received and, when the frame start signal of a next frame is received, instructs the LDPC decode block 11 to output a decoding result.

Referring to FIG. 2, there is shown a flowchart indicative of the decode processing that is executed by the receiving apparatus 10. This processing starts when a decode enable signal of H level is entered from the repetition count control block 12 into the LDPC decode block 11 in response to the frame start signal of a start frame.

In step S11, the LDPC decode block 11 receives a log-likelihood ratio for each frame from the outside. Upon reception of the log-likelihood ratio, the decode enable signal goes L level. In step S12, the LDPC decode block 11 executes LDPC decoding by use of the received log-likelihood ratio. In step S13, the LDPC decode block 11 determines on the basis of a decoding result whether the LDPC decoding has been successful or not.

If the LDPC decoding is found successful in step S13, then the LDPC decode block 11 supplies a decode successful flag to the repetition count control block 12. In response, the repetition count control block 12 instructs the LDPC decode block 11 to output a decoding result. Next, in step S14, the LDPC decode block 11 outputs a decoding result.

In step S15, the repetition count control block 12 determines whether a new frame start signal has been entered or not. If no new frame start signal is found entered in step S15, the repetition count control block 12 waits until a new frame start signal is entered.

On the other hand, if a new frame start signal is found entered in step S15, then the repetition count control block 12 enters a decode enable signal of H level into the LDPC decode block 11, returning the processing procedure to step S11. Consequently, the LDPC decoding for log-likelihood ratio of a frame next to the frame subject to the previous decoding.

If the LDPC decoding is found unsuccessful in step S13, the LDPC decode block 11 supplies a decode unsuccessful flag to the repetition count control block 12. Next, in step S16, the repetition count control block 12 determines whether a new frame start signal has been entered or not.

If no new frame start signal is found entered in step S16, then the repetition count control block 12 instructs the LDPC decode block 11 to execute decoding and returns the processing procedure to step S12. Then, the processing operations of steps S12, S13, and S16 are repeated until LDPC decoding is found successful or a new frame start signal is entered.

On the other hand, if a new frame start signal is found entered in step S16, then the repetition count control block 12 enters a decode enable signal of H level.

Next, in step S17, the LDPC decode block 11 outputs a decoding result in response to the instruction supplied by the repetition count control block 12. Thus, the receiving apparatus 10 is able to repeat the LDPC decoding until the LDPC decoding is successful in a period of time up to the input of a frame start signal of the frame next to the current frame subject to decoding. After the processing of step S17, the processing procedure returns to step S11 to execute the LDPC decoding for the log-likelihood ratio of the frame next to the frame subject to the previous decoding.

Referring to FIG. 3, there is shown a timing chart indicative of operation timings of the receiving apparatus 10 in a condition where the BER (Bit Error Rate) of a decoding result is relatively low. FIG. 4 shows a timing chart indicative of operation timings of the receiving apparatus 10 in a condition where the BER of a decoding result is relatively high.

As shown in FIG. 3, in the condition where the BER of a decoding result is relatively low, error correction converges with a relatively small repetitive decoding count, so that the power consumption is held down by stopping the LDPC decoding if the LDPC decoding is successful.

On the other hand, as shown in FIG. 4, in the condition where the BER of a decoding result is relatively high, the repetitive execution of decoding cannot sufficiently execute the error correction, so that the decoding is repeated until the input of a next frame start signal. This keeps the power consumption always at a high level.

So, techniques were proposed that, if the repetitive execution of decoding cannot achieve the sufficient error correction, the repetitive decoding is stopped by detecting the insufficient error correction, thereby holding down the power consumption (refer to JP-T-2008-544692 and Japanese Patent Laid-open No. 2007-81640).

Further, a technique was proposed that the repetitive decoding count is controlled on the basis of communication path conditions, such as signal-to-noise ratio (SNR), noise power, noise quantity, and so on (refer to Japanese Patent Laid-open No. 2009-38707).

SUMMARY OF THE INVENTION

When an LDPC code is used for digital television broadcasting and BER is so high as to disable the displaying of an image, for example, there is no actual harms on the digital television system in its entirety if the LDPC code itself is stopped rather than limiting the LDPC code repetition count. If the LDPC code itself is stopped, the power consumption can be held down more.

However, if the LDPC code is stopped once, BER and so on cannot be measured, thereby disabling the restarting of the LDPC code with BER and so on used as indexes. Therefore, if a condition occurs in which BER is so low as to make the error correction converge with a small repetitive decoding count, the LDPC code cannot be decoded.

Therefore, the present invention addresses the above-identified and other problems associated with related-art methods and apparatuses and solves the addressed problems by providing a receiving apparatus, a receiving method and program, and a receiving system that are configured to hold down the power consumption in a bad condition while normally decoding LDPC codes in a good condition.

In carrying out the invention and according to a first embodiment thereof, there is provided a receiving apparatus. This receiving apparatus includes: decoding means for receiving and decoding an low density parity check code; and decoding control means for controlling a frequency of the decoding on the basis of conditional information that is an index indicative of a communication condition that influences power consumption in the decoding means.

A receiving method and a program of the first embodiment of the invention correspond to the above-mentioned receiving apparatus of the first embodiment of the invention.

In the first embodiment of the invention, a received LDPC code is decoded and, on the basis of conditional information that is an index indicative of communication condition that influences the power consumption at the time of the decoding, the frequency of the decoding is controlled.

In carrying out the invention and according to a second embodiment thereof, there is provided a receiving system. This receiving system includes: acquisition means for acquiring a signal from a transmission path; and transmission path decode processing means for executing transmission path decode processing on a signal acquired by the acquisition means. The transmission path decode processing means has decoding means for decoding a low density parity check code of the signal, and decoding control means for controlling a frequency of the decoding on the basis of conditional information that is an index indicative of communication condition that influences power consumption in the decoding means.

In the second embodiment of the invention, a signal is acquired from a transmission path and transmission path decode processing is executed on the acquired signal. In the transmission path decode processing, the LDPC code of the signal is decoded and, on the basis of conditional information that is an index indicative of communication condition that influences the power consumption at the time of the decoding, the frequency of the decoding is controlled.

In carrying out the invention and according to a third embodiment thereof, there is provided a receiving system. This receiving system includes: transmission path decode processing means for executing transmission path decode processing on a signal acquired from a transmission path; and information source decode processing means for executing information source decode processing on the signal executed with the transmission path decode processing by the transmission path decode processing means. This transmission path decode processing means has decoding means for decoding a low density parity check code of the signal, and decoding control means for controlling a frequency of the decoding on the basis of conditional information that is an index indicative of a communication condition that influences power consumption in the decoding means.

In the third embodiment of the invention, transmission path decode processing is executed on the signal acquired from the transmission path and information source decode processing is executed on the signal on which the transmission path decode processing has been processed. In the transmission path decode processing, the LDPC code of the signal is decoded and, on the basis of conditional information that is an index indicative of a communication condition that influences power consumption, the frequency of the decoding is controlled.

In carrying out the invention and according to a fourth embodiment thereof, there is provided a receiving system. This receiving system includes: transmission path decode processing means for executing transmission path decode processing on a signal acquired from a transmission path; and output means for outputting at least one of image data and audio data on the basis of the signal executed with the transmission path decode processing by the transmission path decode processing means. This transmission path decode processing means has decoding means for decoding a low density parity check code of the signal, and decoding control means for controlling a frequency of the decoding on the basis of conditional information that is an index indicative of a communication condition that influences power consumption in the decoding means.

In the fourth embodiment of the invention, transmission path decode processing is executed on the signal acquired from the transmission path and, on the basis of the signal on which the transmission path decode processing has been executed, image data or audio data is outputted. In the transmission path decode processing, the LDPC code of the signal is decoded and, on the basis of conditional information that is an index indicative of communication condition that influences the power consumption at the time of the decoding, the frequency of the decoding is controlled.

In carrying out the invention and according to a fifth embodiment thereof, there is provided a receiving system. This receiving system includes: transmission path decode processing means for executing transmission path decode processing on a signal acquired from a transmission path; and recording control means for controlling recording of the signal executed with the transmission path decode processing by the transmission path decode processing means. This transmission path decode processing means has decoding means for decoding a low density parity check code of the signal, and decoding control means for controlling a frequency of the decoding on the basis of conditional information that is an index indicative of a communication condition that influences power consumption in the decoding means.

In the fifth embodiment of the invention, transmission path decode processing is executed on the signal acquired from the transmission path and the recording of the signal on which the transmission path decode processing has been executed is controlled. In the transmission path decode processing, the LDPC code of the signal is decoded and, on the basis of conditional information that is an index indicative of communication condition that influences the power consumption at the time of the decoding, the frequency of the decoding is controlled.

As described above and according to the embodiment of the invention, the power consumption in bad conditions can be held down while decoding LDPC codes in good conditions.

DETAILED DESCRIPTION OF THE PREFERRED EMBODIMENTS

<First Embodiment>
[Exemplary Configuration of Receiving Apparatus Practiced as First Embodiment]

This invention will be described in further detail by way of embodiments thereof with reference to the accompanying drawings. Now, with reference to FIG. 5, there is shown a block diagram illustrating an exemplary configuration of a receiving apparatus practiced as the first embodiment of the present invention.

Figure 1:
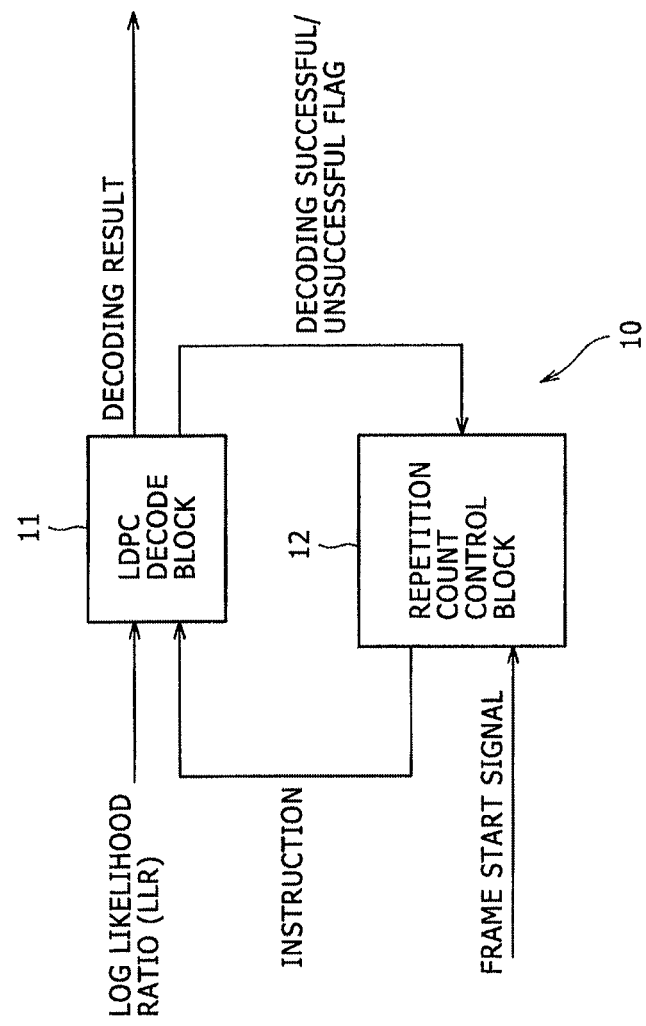
FIG. 1 is a block diagram illustrating a related-art receiving apparatus.
Figure 2:
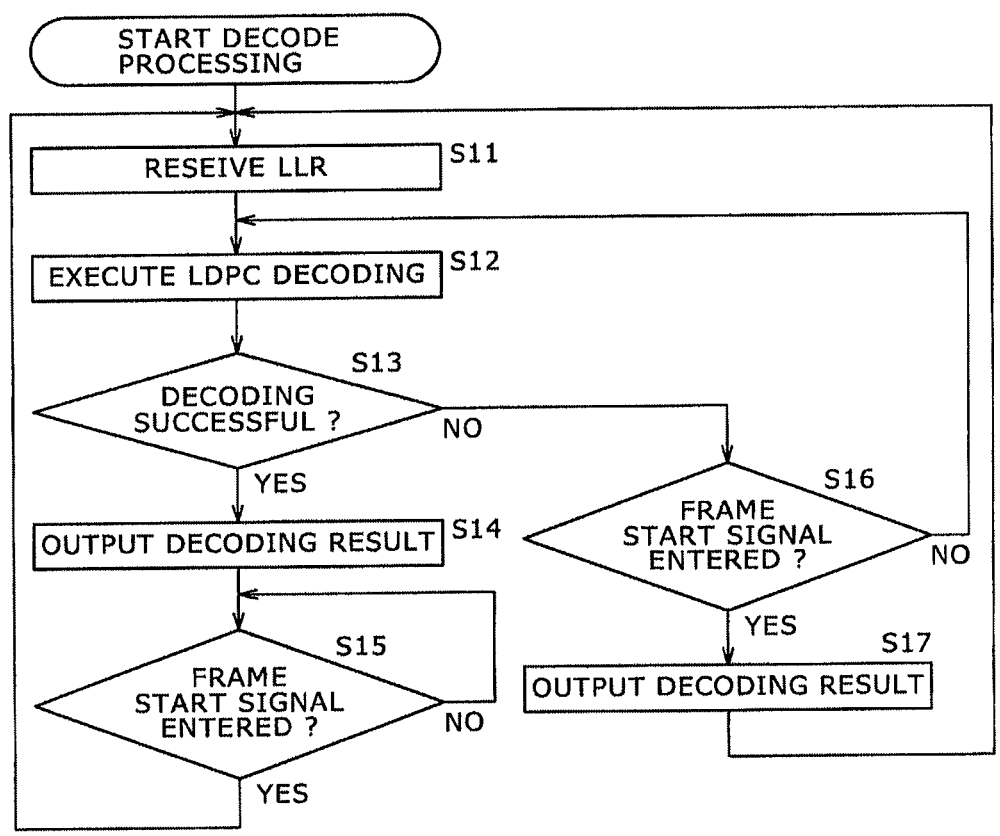
FIG. 2 is a flowchart indicative of the decode processing to be executed by the receiving apparatus shown in FIG. 1.
Figure 3:
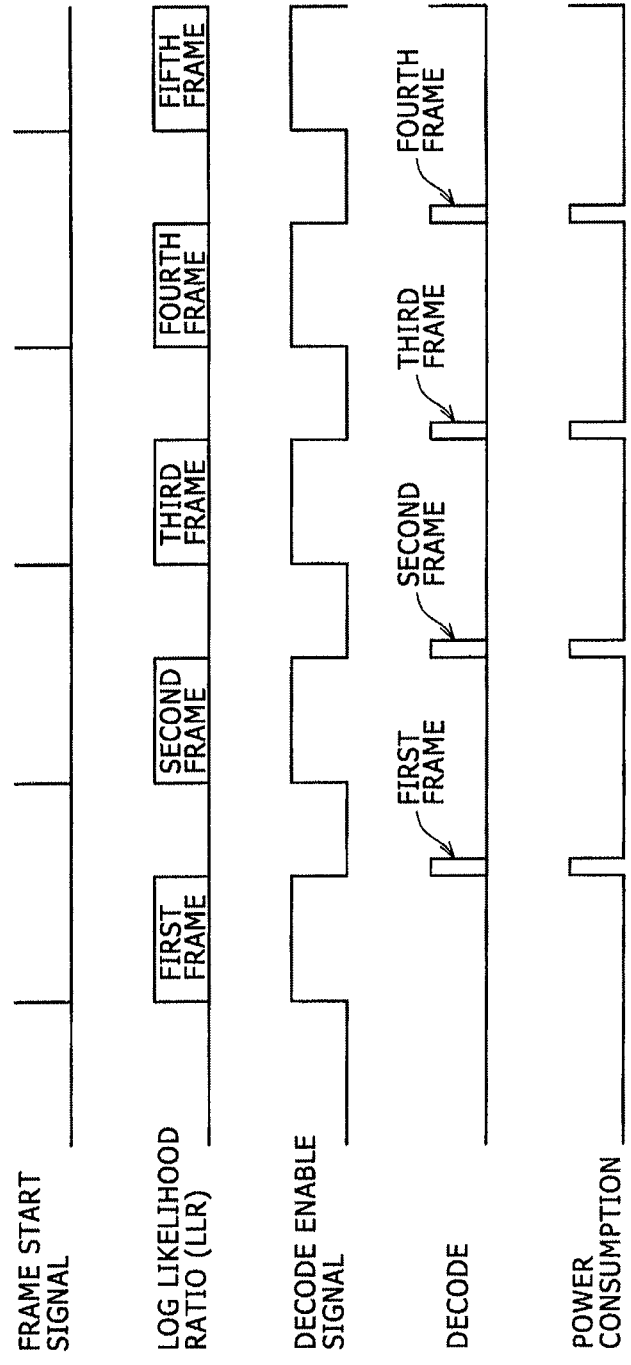
FIG. 3 is a timing chart indicative of operation timings of the receiving apparatus shown in FIG. 1 in a condition where BER is low.
Figure 5:
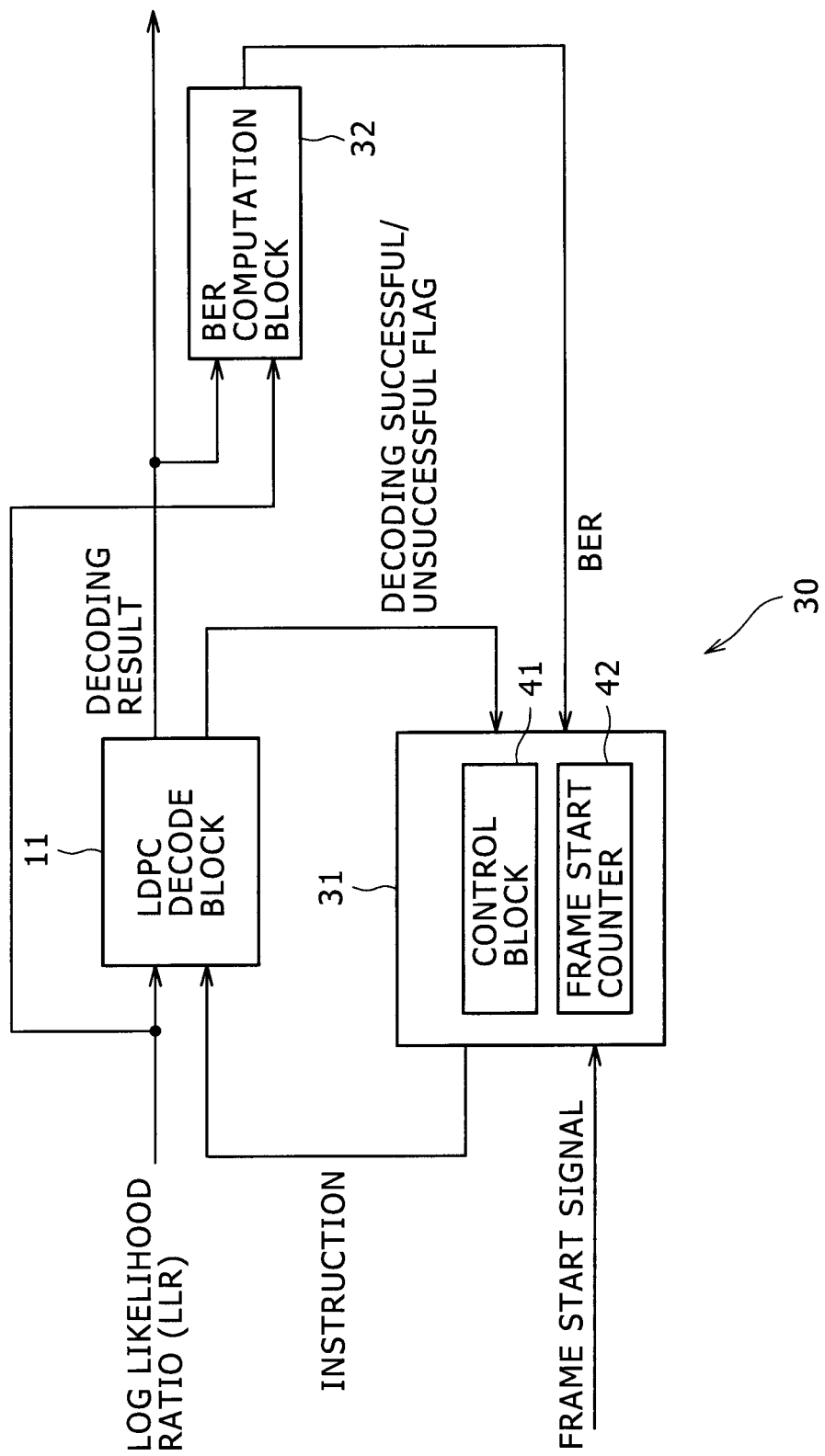
FIG. 5 is a block diagram illustrating an exemplary configuration of a receiving apparatus practiced as a first embodiment of the invention.

With reference to FIG. 5, components similar to those previously described with reference to FIG. 1 are denoted by the same reference numerals. The description duplicate with that made with reference to FIG. 1 is skipped appropriately.

The configuration of a receiving apparatus 30 shown in FIG. 5 differs from that shown in FIG. 1 mainly in that a repetition count control block 31 is arranged in place of the repetition count control block 12 and a BER computation block 32 is newly arranged. The receiving apparatus 30 controls the frequency of LDPC decoding by using, as an index, BER that is conditional information providing an index indicative of communication conditions affecting the power consumption at the time of decoding.

To be more specific, the repetition count control block 31 is composed of a control block 41 and a frame start counter 42. In the repetition count control block 31, a frame start signal is entered.

The control block 41 enters a decode enable signal into an LDPC decode block 11 on the basis of a BER supplied from the BER computation block 32 and a count value supplied from the frame start counter 42, there by controlling the frequency of LDPC decoding.

In addition, if a decode successful flag is supplied from the LDPC decode block 11, the control block 41 instructs the LDPC decode block 11 to output a decoding result. On the other hand, if a decode unsuccessful flag is supplied from the LDPC decode block 11, the control block 41 instructs the LDPC decode block 11 to execute decoding again before a log-likelihood ratio of a next frame is received; after a log-likelihood ratio of a next frame is received, the control block 41 instructs the LDPC decode block 11 to output a decoding result. Further, on the basis of the a BER supplied from the BER computation block 32, the control block 41 controls the frame start counter 42.

The frame start counter 42 counts the number of times the frame start signal has been entered under the control of the control block 41.

The BER computation block 32 computes a BER on the basis of a decoding result supplied from the LDPC decode block 11 and a log-likelihood ratio entered from the outside, supplying a computed BER to the control block 41 of the repetition count control block 31.

[Processing by the Receiving Apparatus]

Figure 6:
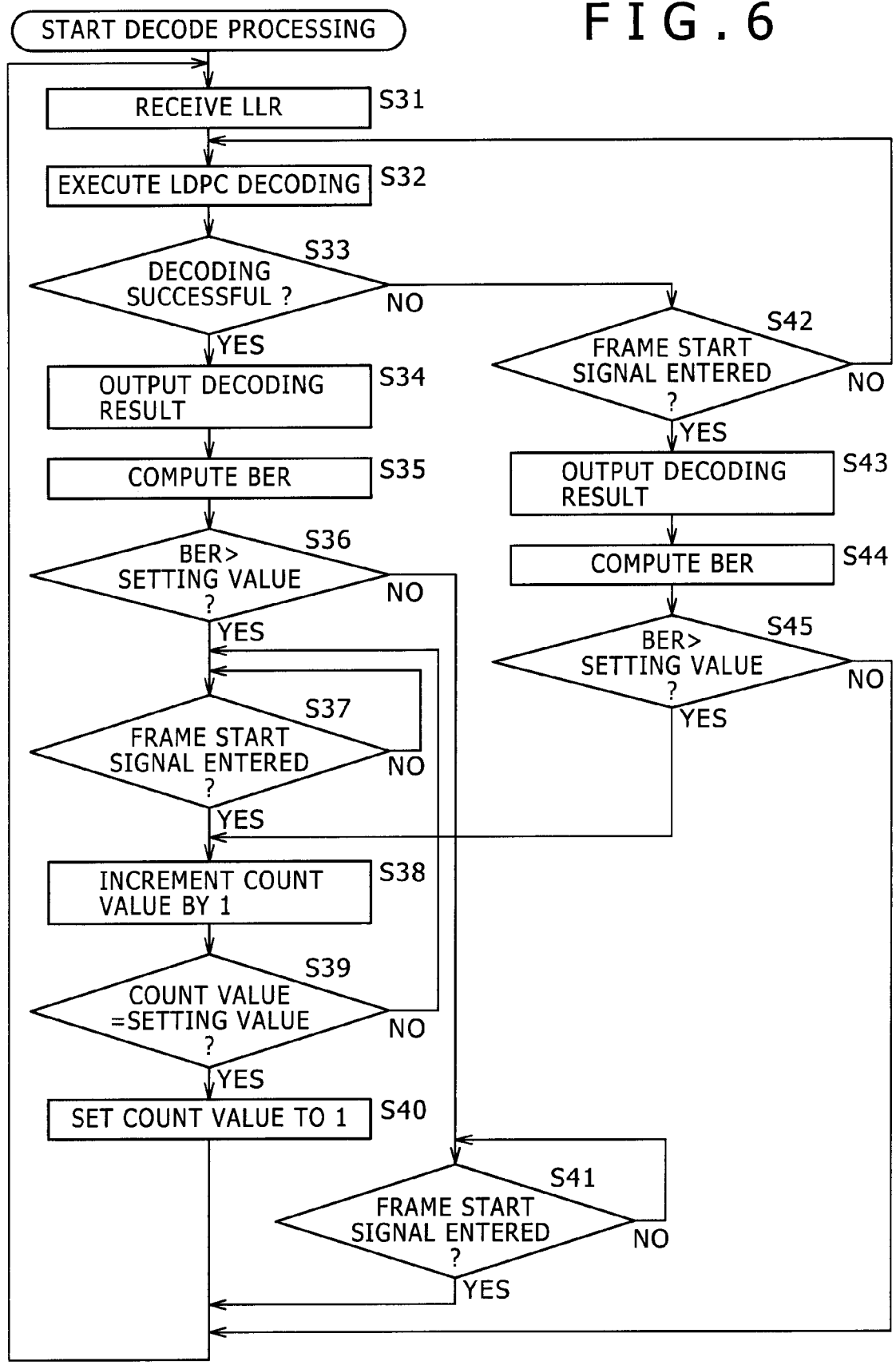
FIG. 6 is a flowchart indicative of the decode processing to be executed by the receiving apparatus shown in FIG. 5.

Referring to FIG. 6, there is shown a flowchart indicative of the decode processing that is executed by the receiving apparatus 30. This decode processing starts when a decode enable signal of H level is entered in the LDPC decode block 11 in response to a frame start signal of a start frame, for example.

In step S31, the LDPC decode block 11 receives a log-likelihood ratio for each frame from the outside. Upon reception of the log-likelihood ratio, the decode enable signal goes L level. In step S32, the LDPC decode block 11 executes LDPC decoding by use of the received log-likelihood ratio. In step S33, the LDPC decode block 11 determines on the basis of a decoding result whether the LDPC decoding is successful or not.

If the LDPC decoding is found successful in step S33, then the LDPC decode block 11 supplies a decode successful flag to the control block 41. Consequently, the control block 41 instructs the LDPC decode block 11 to output the decoding result. Next, in step S34, the LDPC decode block 11 outputs the decoding result.

In step S35, the BER computation block 32 computes a BER on the basis of the log-likelihood ratio of the frame subject to the previous decoding and the decoding result supplied from the LDPC decode block 11 and supplies the obtained BER to the control block 41.

In step S36, the control block 41 determines whether the BER supplied from the BER computation block 32 is higher than a predetermined setting value that is preset. If the BER is found to be higher than the predetermined setting value in step S36, then the control block 41 determines whether a new frame start signal has been entered or not in step S37.

If no new frame start signal is found entered in step S37, then the control block 41 waits until a new frame start signal is entered.

On the other hand, if a new frame start signal is found entered in step S37, then the frame start counter 42 increments the count value by 1 under the control of the control block 41 in step S38. It should be noted that the initial value of the count value is 1.

In step S39, the control block 41 determines whether the count value is equal to the predetermined setting value or not. If the count value is found to be not equal to the predetermined setting value, the processing procedure is returned to step S37. Then, until the count value becomes the predetermined setting value, the processing operations of step S37 through step S39 are repeated.

On the other hand, if the count value is found to be equal to the predetermined setting value in step S39, then the frame start counter 42 initializes the count value to 1 under the control of the control block 41 in step S40. Next, the control block 41 supplies a decode enable signal of H level to the LDPC decode block 11, returning the processing procedure to step S31. Consequently, the LDPC decoding for the log-likelihood ratio of a frame that is the (setting value−1)th frame from the frame subject to the previous decoding is executed.

If the BER is found to be below a predetermined setting value in step S36, then the control block 41 determines in step S41 whether a new frame start signal has been entered or not. If no new frame start signal is found entered in step S41, then the control block 41 waits until a new frame start signal is entered.

On the other hand, if a new frame start signal is found entered in step S41, then the control block 41 supplies a decode enable signal of H level to the LDPC decode block 11. The processing procedure is returned to step S31. Thus, the LDPC decoding for the log-likelihood ratio of a frame next to the frame subject to the previous decoding is executed.

If the LDPC decoding is found unsuccessful in step S33, then the LDPC decode block 11 supplies a decode unsuccessful signal to the control block 41. In step S42, the control block 41 determines whether a new frame start signal has been entered or not.

If no new frame start signal is found entered in step S42, then the control block 41 instructs the LDPC decode block 11 to execute decoding and returns the processing procedure to step S32. Next, the processing operations of steps S32, S33, and S42 are repeated until the LDPC decoding is successful or a new frame start signal is entered.

On the other hand, if a new frame start signal is found entered in step S42, then the control block 41 instructs the LDPC decode block 11 to output a decoding result. Next, in step S43, the LDPC decode block 11 outputs a decoding result in response to the instruction supplied from the control block 41.

Thus, the receiving apparatus 30 is able to repeat the LDPC decoding until the LDPC decoding is successful during a period of time where a frame start signal of a frame next to the frame subject to the current decoding.

In step S44, the BER computation block 32 computes a BER on the basis of the log-likelihood ratio of the frame subject to the previous decoding and the decoding result supplied from the LDPC decode block 11 and supplies the obtained BER to the control block 41.

In step S45, the control block 41 determines whether the BER supplied from the BER computation block 32 is higher than a preset predetermined setting value. If the BER is found to be higher than the preset determined setting value in step S45, then the processing procedure goes to step S38 to execute the subsequent processing.

On the other hand, if the BER is found to be below the predetermined setting value in step S45, the control block 41 enters a decode enable signal of H level into the LDPC decode block 11, returning the processing procedure to step S31. Thus, the LDPC decoding for the log-likelihood ratio of a frame next to the frame subject to the previous decoding is executed.

Figure 7:
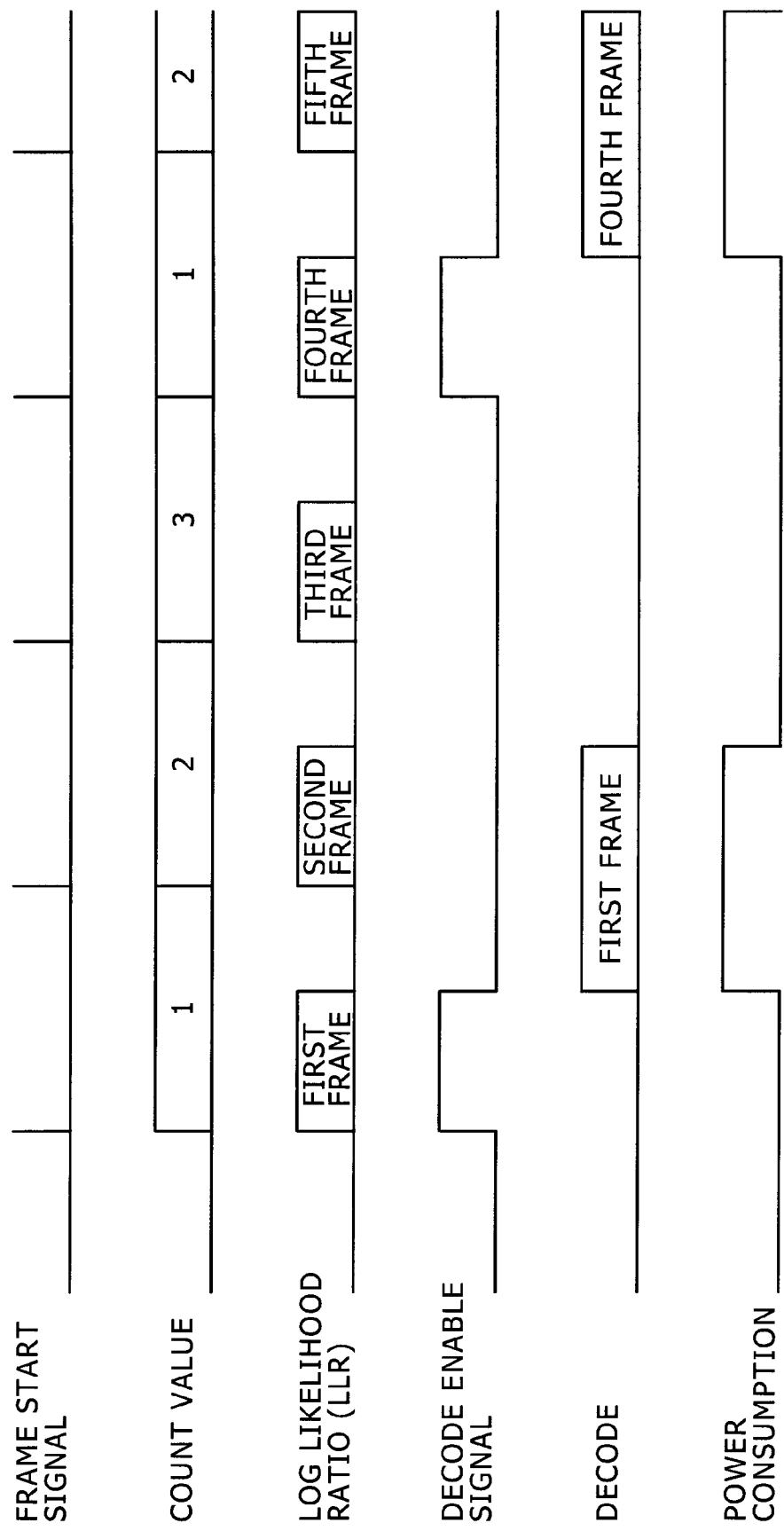
FIG. 7 is a timing chart indicative of operation timings of the receiving apparatus shown in FIG. 5 when BER is high.

Referring to FIG. 7, there is shown a timing chart indicative of operations timings of the receiving apparatus 30 in the case where the BER is higher than a predetermined setting value.

As shown in FIG. 7, first, when a frame start signal of a first frame is entered, the control block 41 enters a decode enable signal of H level into the LDPC decode block 11. This causes the LDPC decode block 11 to receive the log-likelihood ratio of the first frame and executes the LDPC decoding on this log-likelihood ratio. At this time, the count value of the frame start counter 42 is 1 as initial value. It should be noted that, when the reception of the log-likelihood ratio of the first frame has been completed, the decode enable signal goes L level.

In the example shown in FIG. 7, the LDPC decoding of the first frame is unsuccessfully repeated until the reception of the log-likelihood ratio of a second frame next to the first frame and a decoding result is outputted. Also, in the example shown in FIG. 7, the BER is higher than the setting value, so that, when the frame start signal of the second frame is entered, the count value is incremented to 2.

If the setting value for use in count value determination is 4 for example, the log-likelihood ratio of the second frame is received as shown in FIG. 7 but no LDPC decoding is executed because the count value is 2. Then, when the log-likelihood ratio of a third frame is entered, the log-likelihood ratio of the third frame is received and the count value is incremented by 1 to 3. In this case, too, the count value is not 4, so that the LDPC decoding of the third frame is not executed.

Next, when a frame start signal of a fourth frame is entered, the log-likelihood ratio of the fourth frame is received and the count value is incremented by 1 to 4. In this case, because the count value is 4, the decode enable signal goes H level and, at the same time, the count value is initialized to 1, thereby executing the LDPC decoding of the fourth frame.

Subsequently, the LDPC decoding is executed on every three frames until the BER goes below a predetermined setting value as described above. That is, the LDPC decoding of the first frame, the fourth frame, ..., (3n+1)th frame (n being an integer greater than or equal to 0) is executed.

The power consumption of the receiving apparatus is dominant at the time of LDPC decoding, so that the receiving apparatus 30 executes the LDPC decoding on every three frames, thereby reducing the power consumption to 1/3 of a situation in which the LDPC decoding is executed on every frame.

In addition, if the BER is higher than a predetermined setting value, the receiving apparatus 30 executes the LDPC decoding at predetermined intervals, so that the receiving apparatus 30 is able to compute the BER at predetermined intervals. As a result, if the BER goes below a predetermined threshold value, the LDPC decoding can be restarted. Therefore, the receiving apparatus 30 is able to hold down the power consumption in bad conditions when the BER is in a low condition, namely, while LDPC codes in good conditions are LDPC-decoded.

Figure 4:
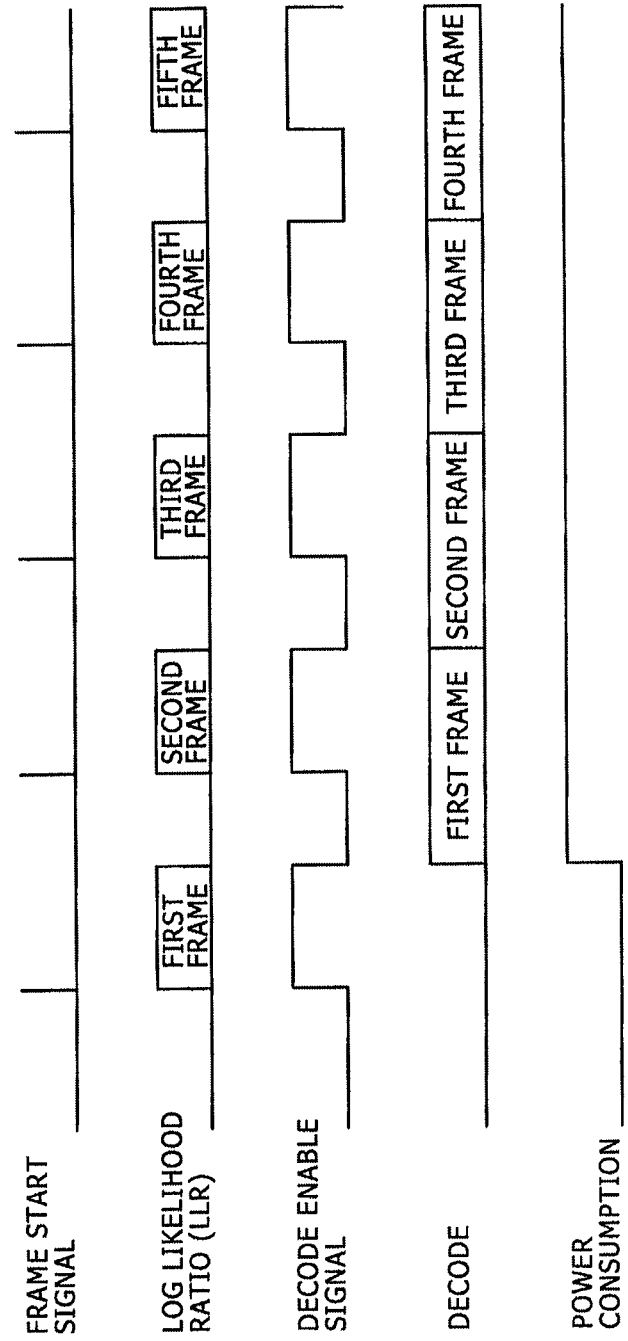
FIG. 4 is a timing chart indicative of operation timings of the receiving apparatus shown in FIG. 1 in a condition where BER is high.

It should be noted that the frequency of LDPC codes in the case where the BER is higher than a predetermined setting value is not obviously limited to the frequency of every three frames. For example, if the frequency of LDPC decoding is every 10 frames, the power consumption is reduced to 1/10 of the case shown in FIG. 4.

[Relation Between Power Consumption and BER]

Figure 8:
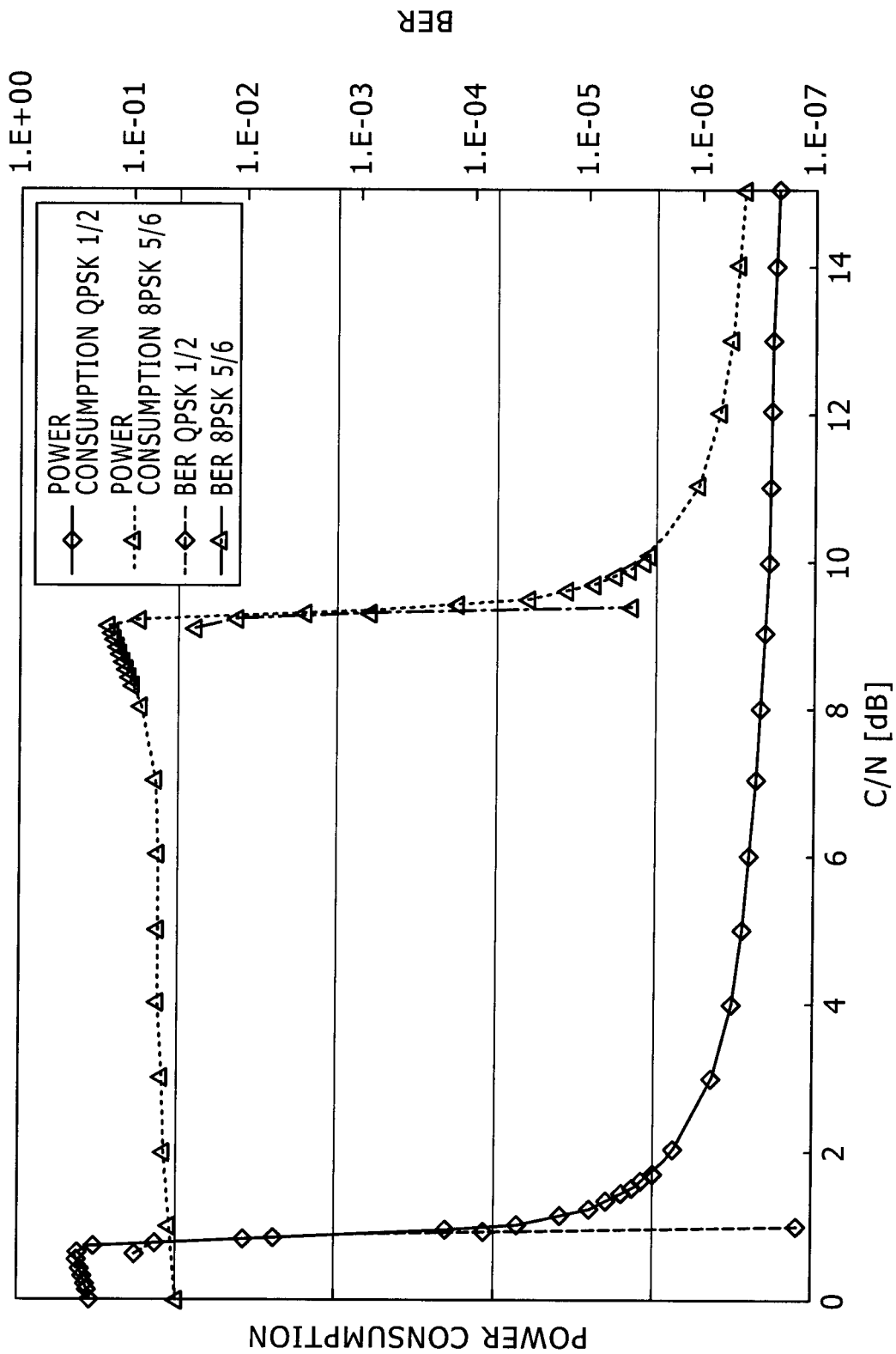
FIG. 8 is a graph indicative of relationships of power consumption and BER.

Referring to FIG. 8, there is shown a relation between power consumption and BER.

In FIG. 8, the horizontal axis is representative of C/N (Carrier to Noise ratio) (dB) of transmission path and the vertical axis is representative of the power consumption and BER at the time of LDPC decoding of the log-likelihood ratio.

As shown in FIG. 8, it is seen that there is a strong correlation between BER and power consumption. To be more specific, as the BER gets higher, the power consumption at the time of LDPC decoding gets higher and, as the BER gets lower, the power consumption at the time of LDPC decoding gets lower. Therefore, the employment of BER an the index of frequency control of the LDPC decoding provides large power consumption reduction effects.

As described above, the receiving apparatus 30 receives an LDPC code, decodes the received LDPC code, and, on the basis of the BER that is conditional information, controls the frequency of the LDPC decoding, so that the receiving apparatus 30 is able to hold down the power consumption in bad conditions while decoding LDPC codes in good conditions.

It should be noted that, for the conditional information by which the frequency of LDPC decoding is controlled, noise information, such as signal-to-noise ratio (SNR), C/N, noise power, and noise amount, that can be computed by a demodulator (not shown) arranged on the preceding stage of the receiving apparatus 30 can be used.

However, the correlation between noise information and BER may not be constant depending on modulation scheme, code rate, and type of external disturbance, for example. For example, in a phase noise environment, there occurs a situation in which C/N is good but BER is bad. Therefore, in order to reduce the power consumption more effectively, it is required to set setting values for use in noise information determination by considering the correlation between noise information and BER for each case.

<Second Embodiment>

[Exemplary Configuration of Receiving Apparatus Practiced as Second Embodiment]

Figure 9:
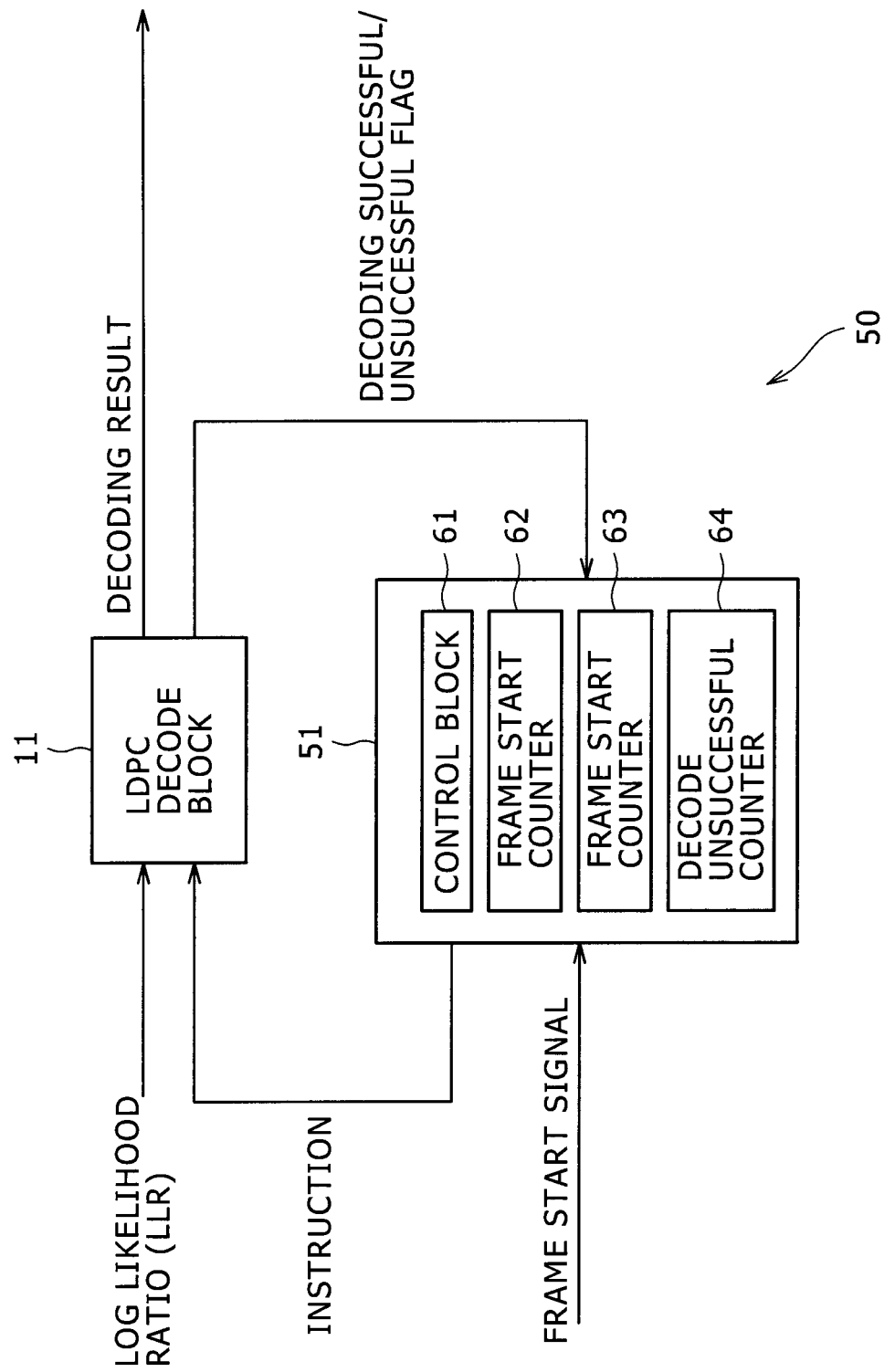
FIG. 9 is a block diagram illustrating an exemplary configuration of a receiving apparatus practiced as a second embodiment of the invention.

Referring to FIG. 9, there is shown a block diagram illustrating an exemplary configuration of a receiving apparatus practiced as the second embodiment of the invention.

With reference to FIG. 9, components similar to those previously described with reference to FIG. 1 are denoted the same reference numerals. The description duplicate with that made with reference to FIG. 1 is skipped appropriately.

The configuration of a receiving apparatus 50 shown in FIG. 9 differs from that shown in FIG. 1 mainly in that a repetition count control block 51 is arranged in place of the repetition count control block 12. The receiving apparatus 50 uses the count of unsuccessful LDPC decoding until a new log-likelihood ratio is received (this count is hereafter referred to as a decode unsuccessful count) as conditional information that provides an index of frequency control. The decode unsuccessful count increases as the error in decoding results increases, so that there is a correlation between the decode unsuccessful count and BER.

The repetition count control block 51 shown in FIG. 9 is composed of a control block 61, frame start counters 62 and 63, and a decode unsuccessful counter 64. In the repetition count control block 51, a frame start signal is entered.

The control block 61 controls the frequency of decoding by entering a decode enable signal into an LDPC decode block 11 on the basis of the count values of the frame start counters 62 and 63, and the decode unsuccessful counter 64.

If a decode successful flag is supplied from the LDPC decode block 11, the control block 61 instructs the LDPC decode block 11 to output a decoding result. On the other hand, if a decode unsuccessful flag is supplied from the LDPC decode block 11, the control block 61 instructs the LDPC decode block 11 to execute decoding again before the log-likelihood ratio of a next frame is received; when the log-likelihood ratio of the next frame is received, the control block 61 instructs the LDPC decode block 11 to output a decoding result.

Further, the control block 61 controls the frame start counter 63 on the basis of a count value of the frame start counter 62 and a decode suppression enable signal indicative of the suppression or non-suppression of decode frequency supplied from the decode unsuccessful counter 64. In addition, the control block 61 controls the decode unsuccessful counter 64 on the basis of a count value of the frame start counter 62.

The frame start counter 62 counts the input count of frame start signals. The frame start counter 63 counts the input count of a frame start signal under the control of the control block 61. The decode unsuccessful counter 64 counts a count of decode unsuccessful flags supplied from the LDPC decode block 11 under the control of the control block 61. The decode unsuccessful counter 64 supplies a decode suppression enable signal to the control block 61 on the basis of the count value.

[Processing by the Receiving Apparatus]

Figure 10:
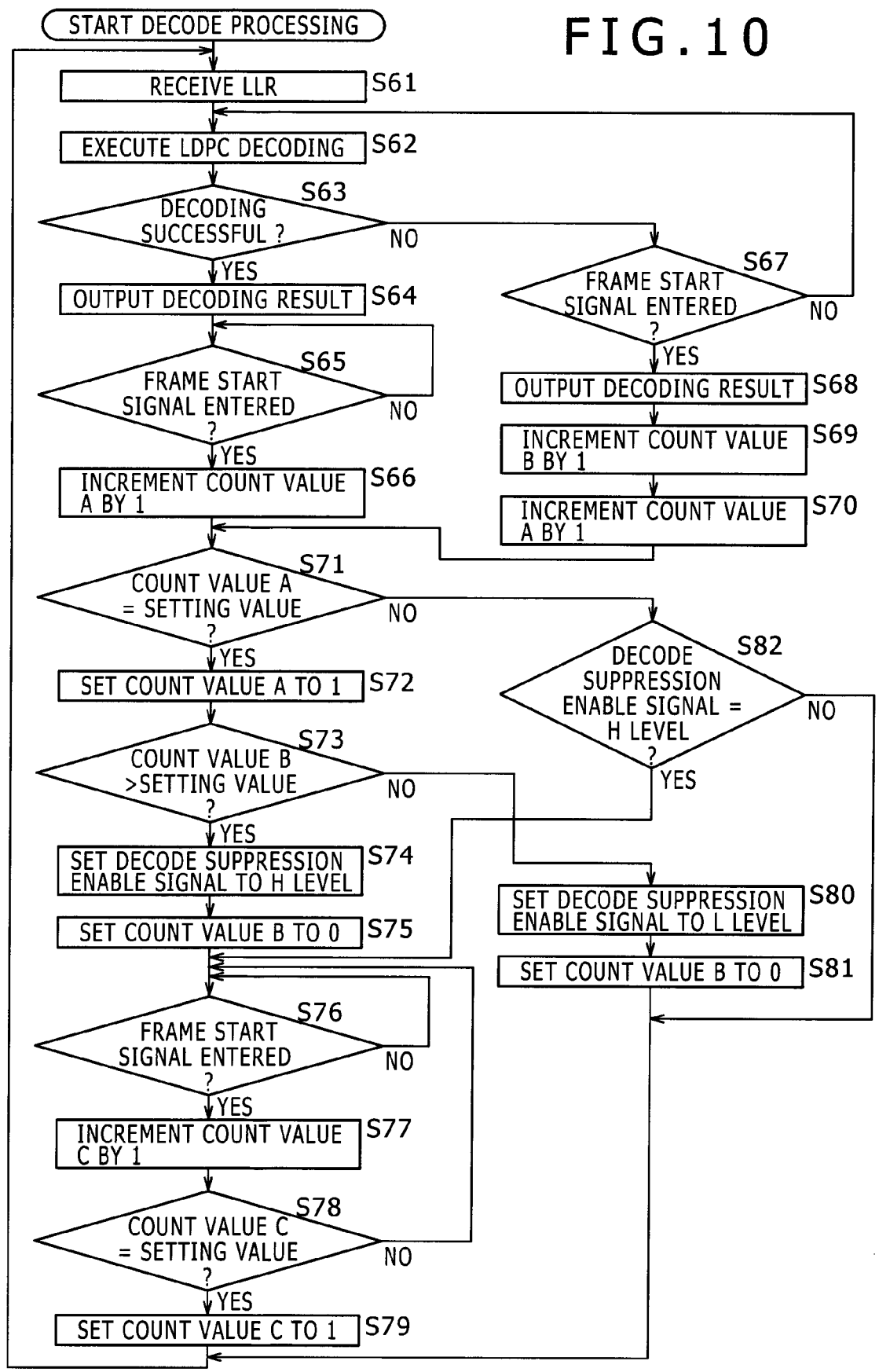
FIG. 10 is a flowchart indicative of the decode processing to be executed by the receiving apparatus shown in FIG. 9.

Referring to FIG. 10, there is shown a flowchart indicative of the decode processing to be executed by the receiving apparatus 50. This decode processing starts when a decode enable signal of H level is entered in the LDPC decode block 11 in response to a frame start signal of the start frame, for example.

In step S61, the LDPC decode block 11 receives the log-likelihood ratio for each frame from the outside. After the reception, a decode enable signal goes L level. In step S62, the LDPC decode block 11 executes the LDPC decoding by use of the received log-likelihood ratio. In step S63, the LDPC decode block 11 determines on the basis of a decoding result whether the LDPC decoding is successful or not.

If the LDPC decoding is found successful in step 63, the LDPC decode block 11 supplies a decode successful flag to the control block 61. In response, the control block 61 instructs the LDPC decode block 11 to output a decoding result. Next, in step S64, the LDPC decode block 11 outputs the decoding result.

In step S65, the control block 61 determines whether a new frame start signal has been entered or not. If no new frame start signal is found entered in step S65, then the control block 61 waits until a new frame start signal is entered.

On the other hand, if a new frame start signal is found entered in step S65, then the frame start counter 62 increments count value A by 1 in step S66, upon which the processing procedure goes to step S71. It should be noted that the initial value of count value A is 1.

If the LDPC decoding is found unsuccessful in step S63, then the LDPC decode block 11 supplies a decode unsuccessful flag to the control block 61. Next, in step S67, the control block 61 determines whether a new frame start signal has been entered or not. If no new frame start signal is found entered in step S67, the processing procedure returns to step S62, in which the processing operations of steps S62, S63, and S67 are repeated until the LDPC decoding is successful or a new frame start signal is entered.

If a new frame start signal is found entered in step S67, then the LDPC decode block 11 outputs a decoding result in step S68. In step S69, the decode unsuccessful counter 64 increments count value B by 1. It should be noted that the initial value of count value B is 0. In step S70, the frame start counter 62 increments count value A by 1, upon which the processing procedure goes to step S71.

In step S71, the frame start counter 62 determines whether count value A is preset predetermined setting value or not. If count value A is found to be a predetermined setting value in step S71, then the frame start counter 62 initializes count value A to 1 in step S72.

In step S73, the decode unsuccessful counter 64 determines count value B is higher than a preset predetermined setting value or not. If count value B is found to be higher than the predetermined setting value in step S73, then the decode unsuccessful counter 64 sets the level of a decode suppression enable signal to H level indicative of the suppression of signal frequency in step S74. This decode suppression enable signal is entered in the control block 61.

In step S75, the decode unsuccessful counter 64 initializes count value B to 0. In step S76, the control block 61 determines whether a new frame start signal has been entered or not. If no new frame start signal is found entered in step S76, the control block 61 waits until a new frame start signal is entered.

On the other hand, if a new frame start signal is found entered in step S76, then the frame start counter 63 increments count value C by 1 in step S77. It should be noted that the initial value of count value C is 1.

In step S78, the frame start counter 63 determines whether count value C is a preset predetermined setting value. If count value C is found not to be the predetermined setting value in step 78, the processing procedure returns to step S76, in which the processing operations of steps S76 through S78 are repeated until count value C becomes the predetermined setting value.

On the other hand, if count value C is found to be the predetermined setting value in step S78, then the frame start counter 63 initializes count value C to 1 in step S79, upon which the processing procedure returns to step S61. Consequently, the LDPC decoding for the log-likelihood ratio of a frame that is the (setting value−1)th frame from the frame subject to the previous decoding is executed.

As described above, in the receiving apparatus 50, if a ratio of decode unsuccessful frames to a predetermined number of frames is higher than a predetermined ratio, the frequency of LDPC decoding is controlled such that the LDPC decoding is executed on every (setting value−1) frames.

On the other hand, if count value B is found to be lower than the predetermined setting value in step S73, then the decode unsuccessful counter 64 sets the level of a decode suppression enable signal to be entered into the control block 61 to L level indicative of non-suppression of decode frequency.

In step S81, the decode unsuccessful counter 64 initializes count value B to 0, upon which the processing procedure returns to step S61. Consequently, the LDPC decoding for the log-likelihood ratio of a frame next to the frame subject to the previous decoding. That is, in the receiving apparatus 50, if a ratio of decode unsuccessful frames to a predetermined number of frames is lower than a predetermined ratio, the LDPC decoding is executed on every frame.

If count value A is found to be not the setting value in step S71, then the control block 61 determines in step S82 whether the level of a decode suppression enable signal entered from the decode unsuccessful counter 64 is H level or not. If the level of a decode suppression enable signal is found to be H level in step S82, the procedure goes to step S76, in which the subsequent processing operations are executed therefrom. That is, the frequency of the LDPC decoding is controlled such that the LDPC decoding is executed on every (setting value −1) frames.

On the other hand, if the level of a decode suppression enable signal is found to be L level in step S82, then the processing procedure returns to step S61, in which the subsequent processing operations are executed therefrom. That is, the LDPC decoding is executed on every frame.

Thus, the frequency of LDPC decoding is controlled for each of the predetermined number of frames in the receiving apparatus 50.

Figure 11:
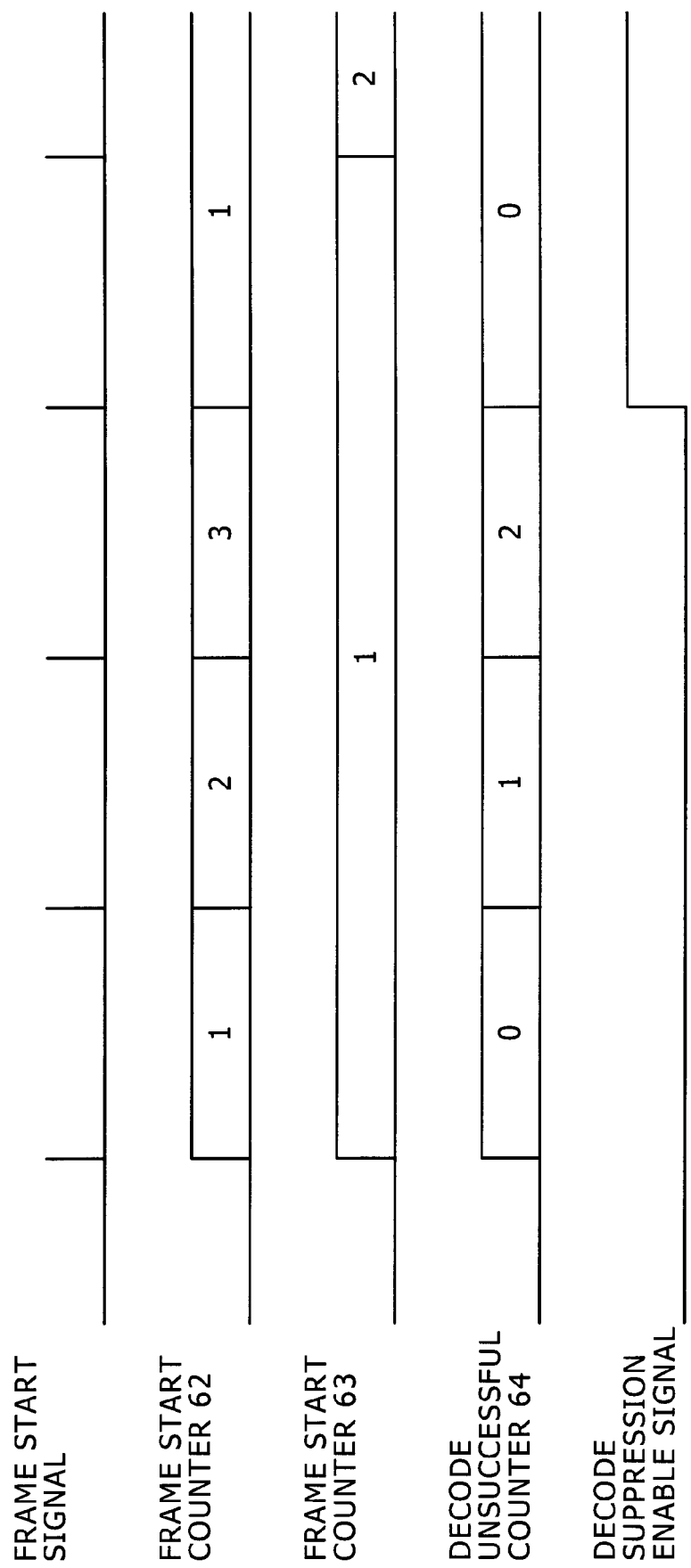
FIG. 11 to FIG. 13 are timing charts indicative of operation timings of the receiving apparatus shown in FIG. 9.

Referring to FIG. 11, there is shown a timing chart indicative of operation timings of the frame start counters 62 and 63 and the decode unsuccessful counter 64 in the receiving apparatus 50.

In the example shown in FIG. 11, the receiving apparatus 50 failed executing the LDPC decoding of the first through third frames. It is assumed that the setting value for use in the determination of a count value of the frame start counter 62 be 4 and the setting value for use in the determination of a count value of the decode unsuccessful counter 64 be 2.

In this case, as shown in FIG. 11, every time a frame start signal is entered, the frame start counter 62 increments count value A by 1 from initial value 1 to setting value 4 and initializes count value A to 1 when count value A has reached setting value 4. In addition, every time a decode unsuccessful flag is entered during a period in which count value A reaches setting value 4, the decode unsuccessful counter 64 increments count value B by 1 from initial value 0. In the example shown in FIG. 11, the decoding of the first through third frames was unsuccessful, so that the count value B is incremented up to 3 and initialized to 0 when count value A has reached 4.

When count value A has reached 4, count value B is 3, higher than setting value 2, so that the level of the decode suppression enable signal goes H level. It should be noted that, in the example shown in FIG. 11, the initial level of the decode suppression enable signal is L level.

When the level of the decode suppression enable signal goes H level, the frame start counter 63 increments count value C by 1 from initial value 1 every time a frame start signal is entered. At this moment, count value A of the frame start counter 62 and count value B of the decode unsuccessful counter 64 remain unchanged at the initial values.

Next, when count value C of the frame start counter 63 has reached a predetermined value, the frame start counter 62 and the decode unsuccessful counter 64 restart counting, repeating the above-mentioned processing operations.

Figure 12:
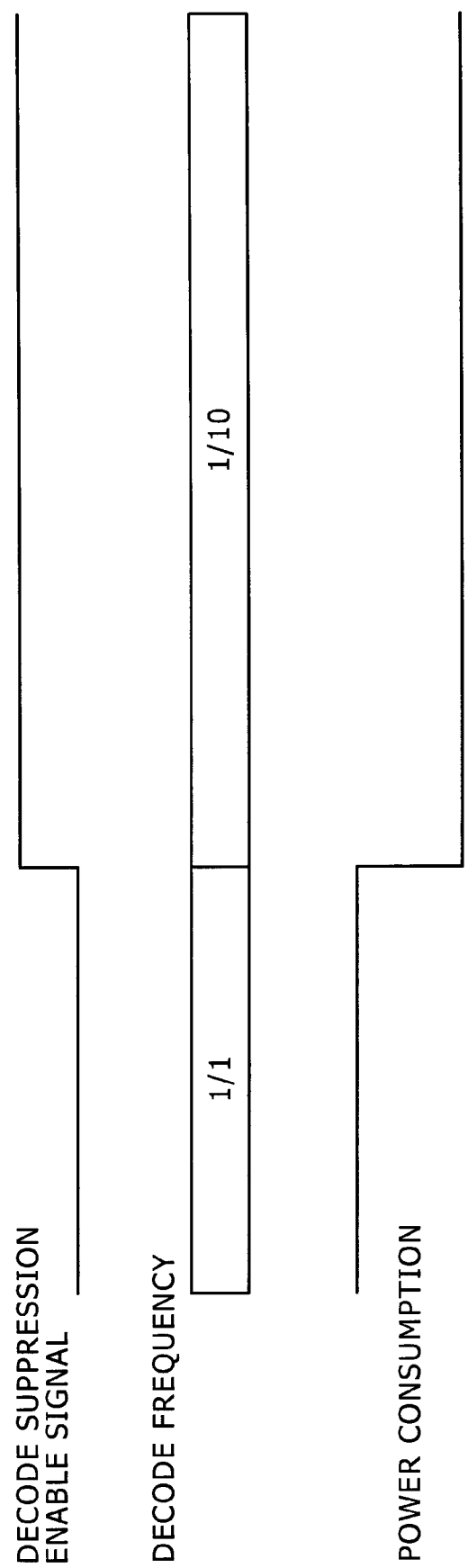
Figure 13:
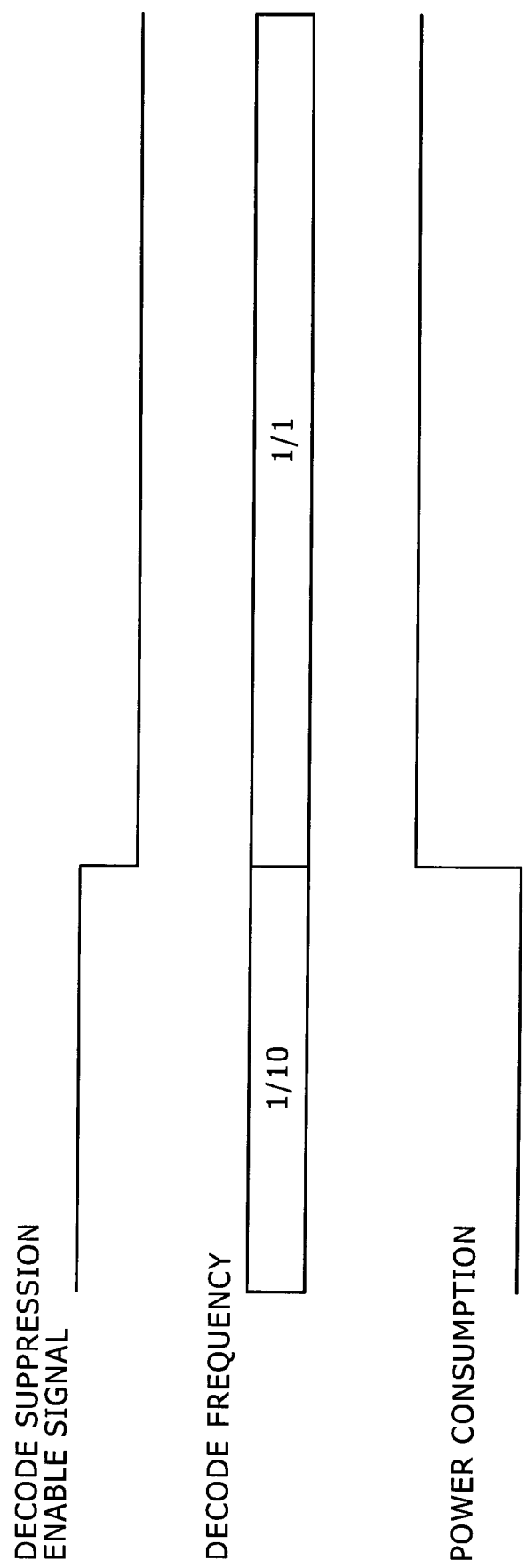

FIG. 12 and FIG. 13 are timing charts indicative of operation timings of the control block 61 of the receiving apparatus 50.

FIG. 12 shows operation timings at the time when the level of a decode suppression enable signal goes from L level to H level. FIG. 13 shows operation timings at the time when the level of the decode suppression enable signal goes from H level to L level.

As shown in FIG. 12, when the level of the decode suppression enable signal goes from H level to L level, the frequency of decoding changes from (1/1) to 1/(setting value−1) (1/10 in the example shown in FIG. 12) for each frame. As shown in FIG. 13, when the level of the decode suppression enable signal goes from L level to H level, the frequency of decoding is changed from 1/(setting value−1) (1/10 in the example shown in FIGS. 13) to (1/1) for each frame.

Figure 14:
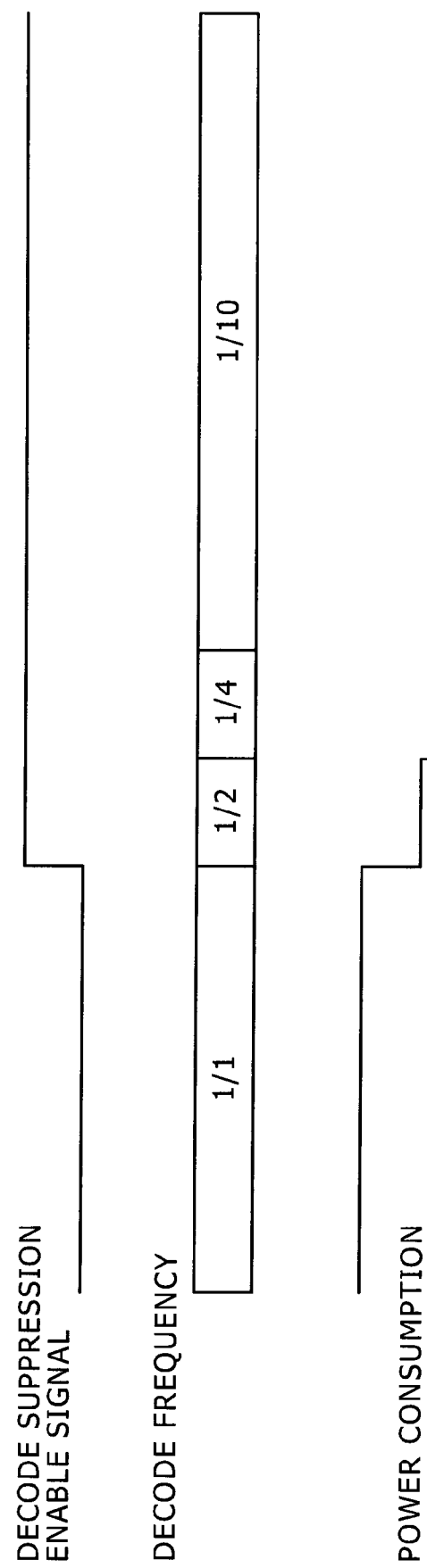
FIG. 14 and FIG. 15 are timing charts indicative of other operation timings of the receiving apparatus shown in FIG. 9.
Figure 15:
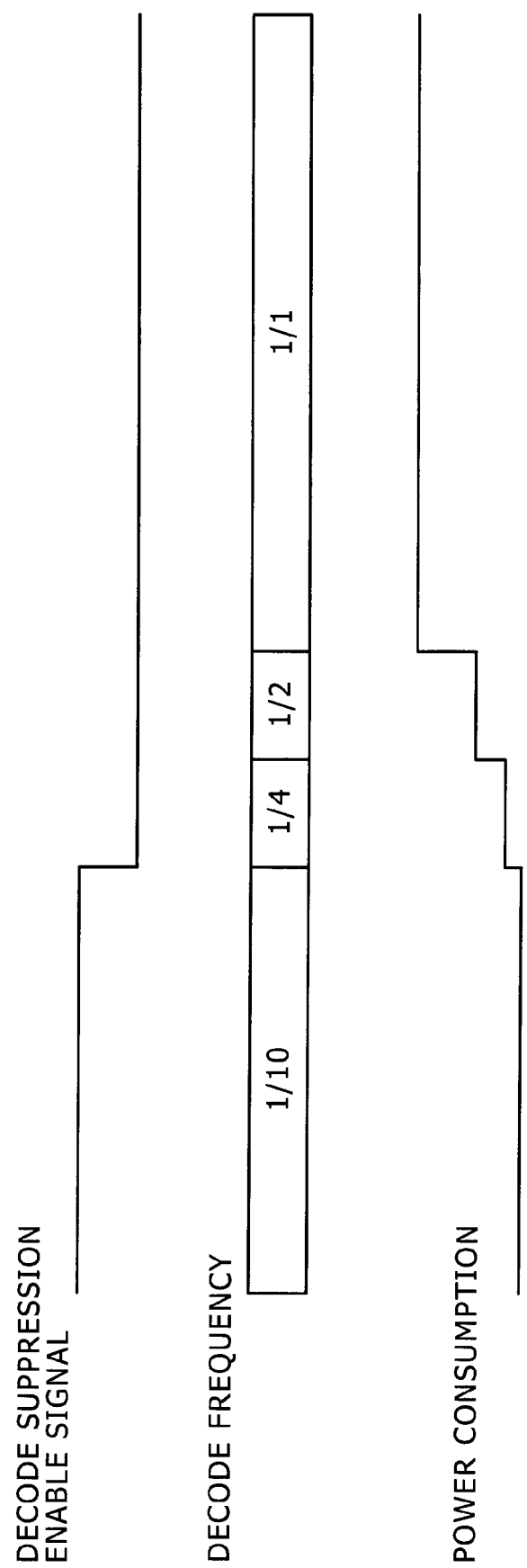

It should be noted that a predetermined setting value for use in the determination of count value C may be changed from time to time and the frequency of decoding may be changed stepwise. In this case, when the frequency of decoding is gradually changed to 1/1 to 1/2 to 1/4 to 1/10 in this order as shown in FIG. 14, for example. When the level of the decode suppression enable signal is changed from H level to L level, the frequency of decoding is gradually changed to 1/10 to 1/4 to 1/2 to 1/1 in this order as shown in FIG. 15, for example. Therefore, in this case, an abrupt power supply variation can be suppressed. This technique of gradually changing the frequency of decoding is applicable to the first embodiment of the invention.

It should be noted that the receiving apparatus 50 described above uses the unsuccessful count of LDPC decoding as conditional information; it is also practicable to use, as the conditional information, such statistical values as decoding count and integrated value of decoding counts that are correlated with BER.

<Third Embodiment>
[Exemplary Configuration of Receiving Apparatus Practiced as Third Embodiment]

Figure 16:
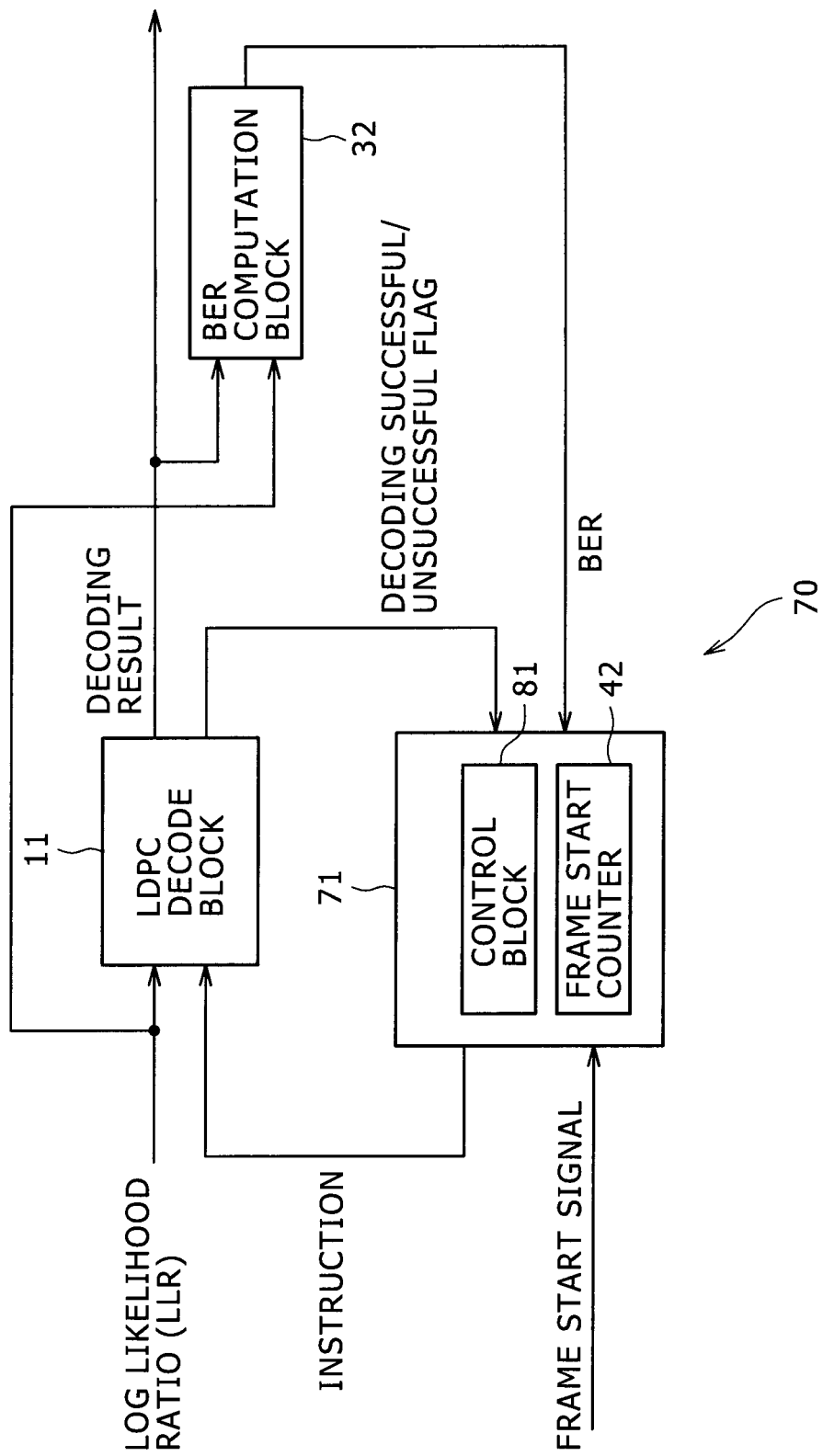
FIG. 16 is a block diagram illustrating an exemplary configuration of a receiving apparatus practiced as a third embodiment of the invention.

Referring to FIG. 16, there is shown a block diagram illustrating an exemplary configuration of a receiving apparatus practiced as the third embodiment of the invention.

With reference to FIG. 16, components similar to those previously described with reference to FIG. 5 are denoted the same reference numerals. The description duplicate with that made with reference to FIG. 5 is skipped appropriately.

The configuration of a receiving apparatus 70 shown in FIG. 16 differs from that shown in FIG. 5 mainly in that a repetition count control block 71 is arranged in place of the repetition count control block 31. The receiving apparatus 70 controls the speed of LDPC decoding on the basis of a free time in which LDPC decoding is not executed, from the output of a decoding result of a predetermined frame to the reception of a log-likelihood ratio of a next frame.

To be more specific, the repetition count control block 71 is composed of a control block 81 and a frame start counter 42. In the repetition count control block 71, a frame start signal is entered.

On the basis of a BER supplied from a BER computation block 32 and a count value of the frame start counter 42, the control block 81 enters a decode enable signal into an LDPC decode block 11 to control the frequency of decoding.

If a decode success flag is supplied from the LDPC decode block 11, the control block 81 instructs the LDPC decode block 11 to output a decoding result. On the other hand, if a decode unsuccessful flag is supplied from the LDPC decode block 11, the control block 81 instructs the LDPC decode block 11 to execute decoding again before the log-likelihood ratio of a next frame is received and further instructs the LDPC decode block 11 to output a decoding result when the log-likelihood ratio of the next frame is received.

Further, the control block 81 computes a free time on the basis of a reception interval of the log-likelihood ratio, namely, an input interval of a frame start signal, and the output timing of a decoding result. On the basis of the obtained free time, the control block 81 controls the frequency of an operation clock of an LDPC decode, thereby controlling decoding speed.

[Processing by the Receiving Apparatus]

Figure 17:
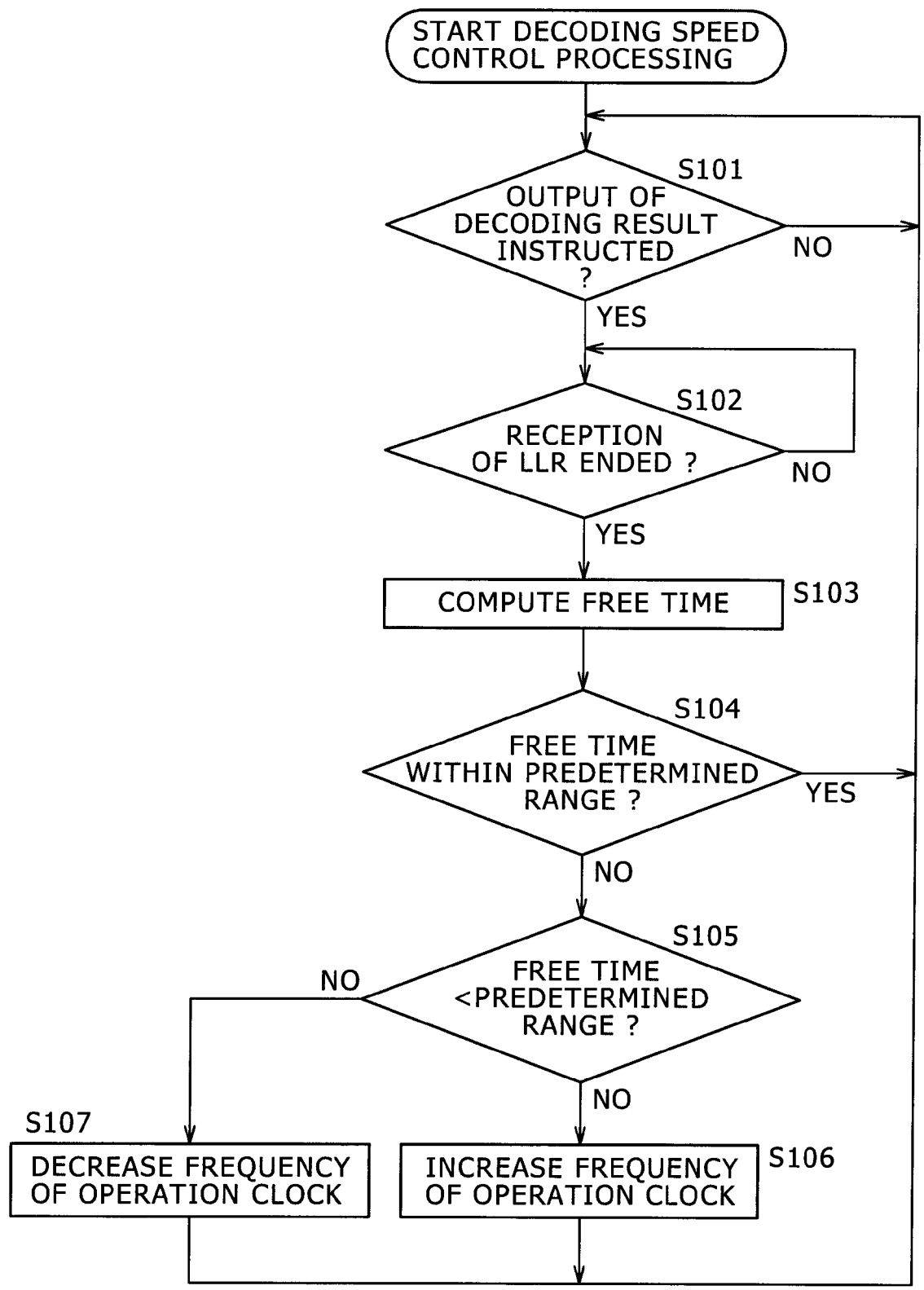
FIG. 17 is a flowchart indicative of decoding speed control processing to be executed by the receiving apparatus shown in FIG. 16.

Referring to FIG. 17, there is shown a flowchart indicative of decoding speed control processing to be executed by the receiving apparatus 70. This decoding speed control processing starts when the frame start signal of a start frame is entered in the receiving apparatus 70.

In step S101, the control block 81 determines whether the LDPC decode block 11 has been instructed to output a decoding result. If the LDPC decode block 11 is found not instructed to output a decoding result in step S101, then the control block 81 waits until the LDPC decode block 11 is instructed to output a decoding result.

On the other hand, if the LDPC decode block 11 is found instructed to output a decoding result in step S101, then the control block 81 determines in step S102 whether the reception by the LDPC decode block 11 of the log-likelihood ratio of a frame next to the frame subject to the previous decoding has ended or not. If the reception is found not ended in step S102, then the control block 81 waits until the reception ends.

If the reception is found ended in step S102, then, in step S103, the control block 81 computes, as a free time, a period of time from instructing the LDPC decode block 11 to output a decoding result to the end of reception of the log-likelihood ratio of a frame next to the frame subject to the previous decoding.

In step S104, the control block 81 determines whether the computed free time is within a predetermined range set in advance. If the free time is found within a predetermined range in step S104, the control block 81 determines that the decoding speed is optimum, upon which the processing procedure returns to step S101.

On the other hand, if the free time is found not within a predetermined range in step S104, then the control block 81 determines in step S105 whether the free time is smaller than the predetermined range or not. If the free time is found smaller than the predetermined range in step S105, then the control block 81 determines that the decoding speed is slow and, in step S106, raises the frequency of the operation clock of the LDPC decoding to be executed by the LDPC decode block 11. Next, the processing procedure returns to step S101 to repeat the above-mentioned processing operations therefrom.

If the free time is found greater than the predetermined range in step S105, then the control block 81 determines that the decoding speed is fast and, in step S107, lowers the frequency of the operation clock of the LDPC decode block 11. Next, the processing procedure returns to step S101 to repeat the processing operations therefrom.

It should be noted that the decoding processing by the receiving apparatus 70 is substantially the same as that by the receiving apparatus 30 shown in FIG. 6, so that the description of the decoding processing by the receiving apparatus 70 is skipped.

[Description of Effects]

Figure 18:
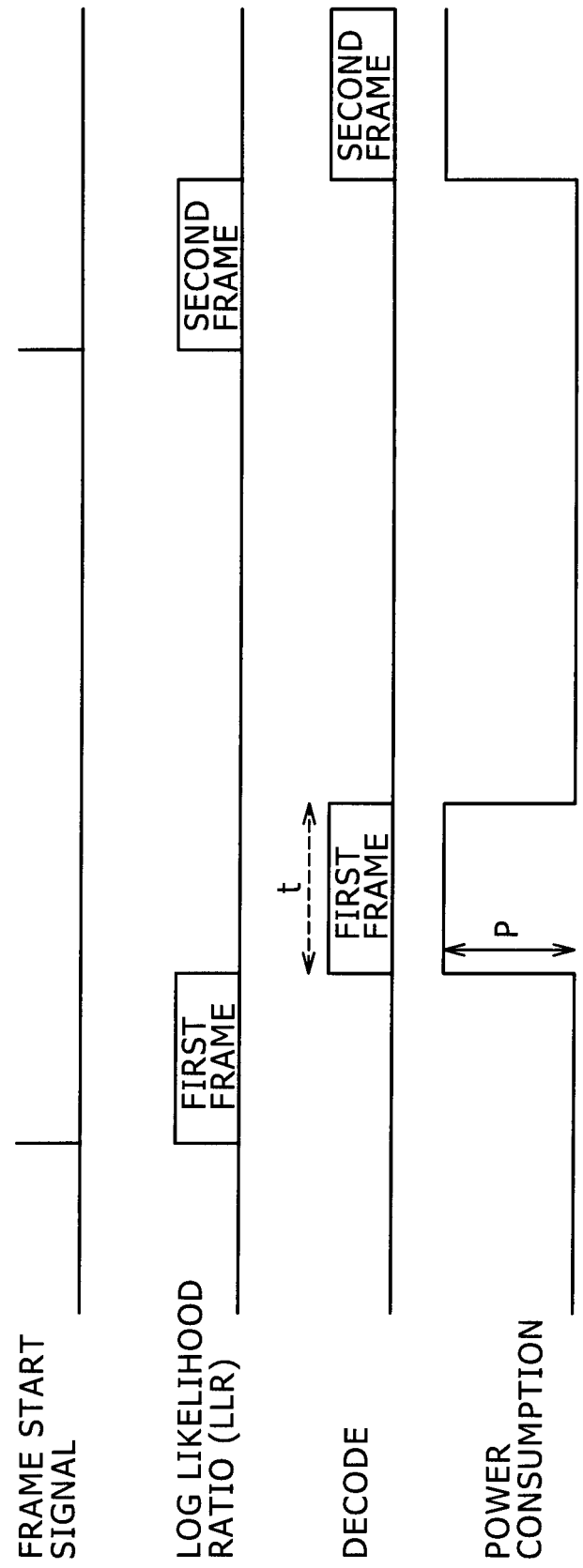
FIG. 18 and FIG. 19 are timing charts indicative of effects brought by the receiving apparatus shown in FIG. 16.
Figure 19:
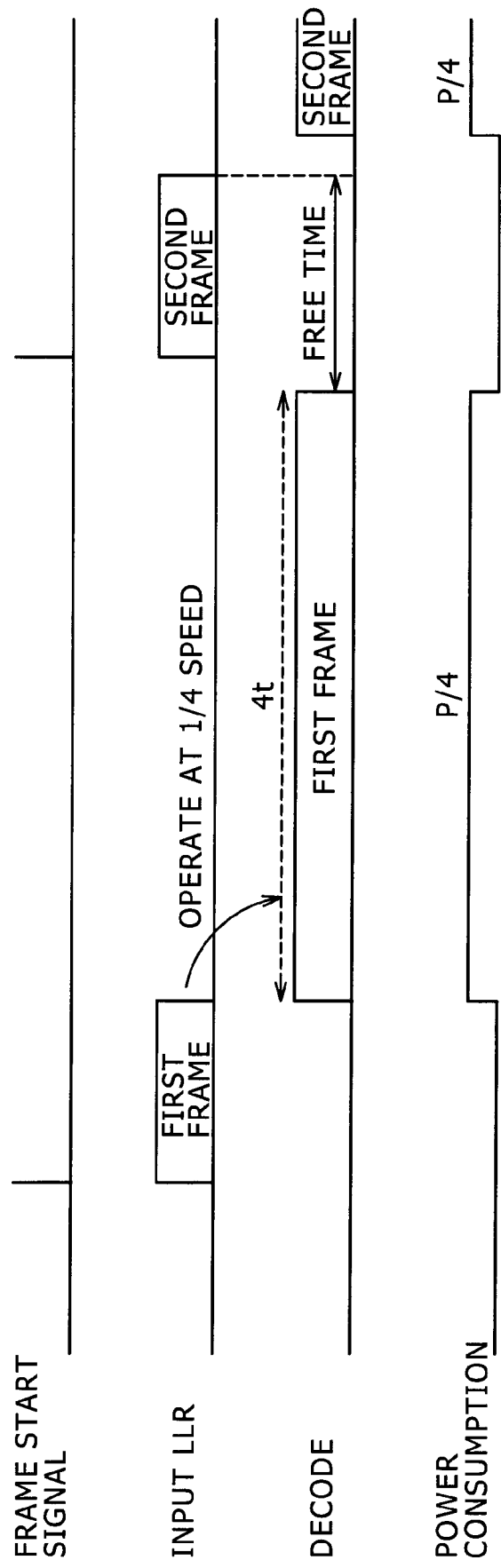

FIG. 18 and FIG. 19 illustrate the effects to be achieved by the receiving apparatus 70.

Referring to FIG. 18, there is shown a timing chart indicative of operation timings of the receiving apparatus that does not control the speed of LDPC decoding. Referring to FIG. 19, there is shown a timing chart indicative of operation timings of the receiving apparatus 70 that controls the speed of LDPC decoding.

As shown in FIG. 18, in the receiving apparatus that does not control the speed of LDPC decoding, LDPC decoding is executed immediately after the end of reception of the log-likelihood ratio, thereby increasing the power consumption; however, LDPC decoding is not executed during a period from a successful decoding to the capture of the log-likelihood ratio of a next frame, thereby causing the power consumption to be low. For example, as shown in FIG. 18, a difference of the power consumption is P between the power consumption during time t from the reception of the log-likelihood ratio of the first frame and the power consumption during a period from a successful decoding to the reception of the log-likelihood ratio of a next frame.

By contrast, as shown in FIG. 19, on the basis of the free time of a frame subject to the previous decoding, the receiving apparatus 70 that controls the speed of LDPC decoding changes the frequency of the operation clock of the LDPC decode block 11 such that the free time of the frame subject to the current decoding gets within a predetermined range. That is, the receiving apparatus 70 averages the operations of LDPC decoding by use of a time obtained by subtracting the time in a predetermined range from the free time.

In the example shown in FIG. 19, the frequency of the operation clock is made 1/4 times the frequency of the operation clock in the case shown in FIG. 18. Consequently, a time from the reception of the log-likelihood ratio of the first frame to the output of a decoding result is 4t, thereby averaging the power consumption within 4t time to P/4. As a result, the peak value of the power consumption can be lowered while a total amount of the power consumption remains unchanged and, at the same time, the variation in power supply can be held down.

As described above, the receiving apparatus 70 is able to receive a log-likelihood ratio to LDPC-decode the received log-likelihood ratio and, on the basis of the reception interval of this log-likelihood ratio, control the speed of LDPC decoding, thereby suppressing the drastic change in power consumption.

It should be noted that, in the receiving apparatus 70, the speed of LDPC decoding is controlled on the basis of the free time of the frame subject to the previous decoding; however, it is also practicable to control the speed of LDPC decoding on the basis of a log-likelihood ratio receiving interval of each frame. This receiving interval can be computed trough a demodulator, not shown, arranged in the preceding stage of the receiving apparatus 70 from the number of symbols per frame and a symbol rate.

Also, the receiving apparatus 70 suppresses power supply variation by controlling the decoding speed by controlling the frequency of the operation clock of the LDPC decode block 11; however, the method of suppressing power supply variation is not limited thereto. For example, power supply variations may be suppressed by controlling the power supply voltage of the LDPC decode block 11 or controlling the voltage to be applied to a substrate terminal of a transistor making up the LDPC decode block 11.

In addition, the method of controlling the decoding speed described with respect to the third embodiment of the invention is also applicable to a receiving apparatus that does not control the frequency of decoding.

Further, the speed of decoding may be changed stepwise like the frequency of decoding described above. In this case, if the frequency of the operation clock is changed from the normal frequency to 1/4 times thereof, the frequency of the operation clock is changed stepwise to 1, 1/2, and 1/4 times the normal frequency in this order. If the frequency of the operation clock is changed from 1/4 times the normal frequency to the normal frequency, the frequency of the operation clock is changed stepwise to 1/4, 1/2, and 1 times the normal frequency in this order.

[Configuration of a Receiving System]

Figure 20:
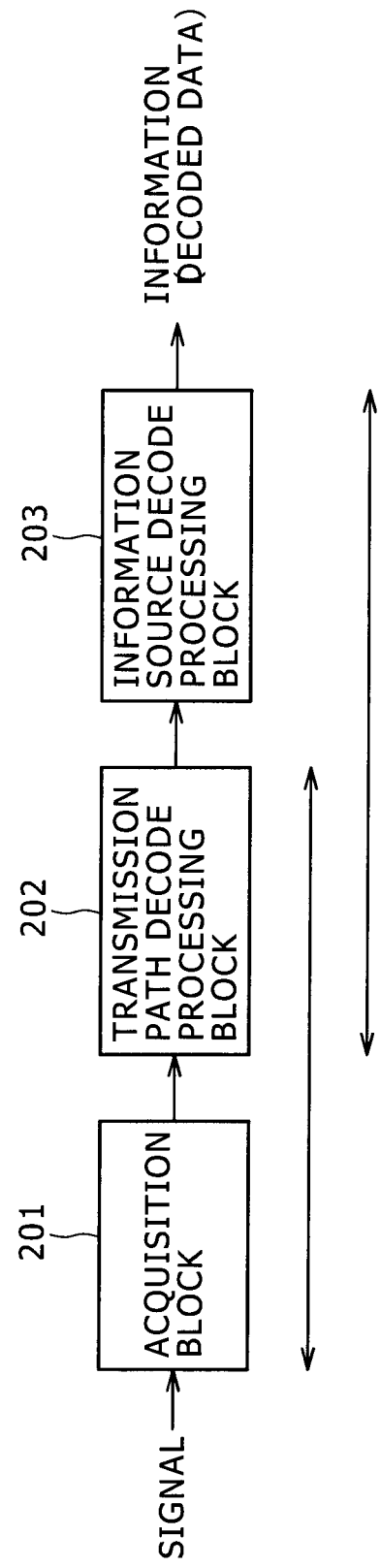
FIG. 20 is a block diagram illustrating a first exemplary configuration of a receiving system applicable to receiving apparatuses.

Referring to FIG. 20, there is shown a block diagram illustrating an exemplary first configuration of a receiving system applicable to the receiving apparatuses 30, 50, and 70 described above.

In FIG. 20, the receiving system is composed of an acquisition block 201, a transmission path decode processing block 202, and an information source decode processing block 203.

The acquisition block 201 acquires a signal that at least includes an LDPC code obtained by LDPC-decoding subject data, such as program's image data and audio data. For example, the acquisition block 201 acquires the signal via a transmission path, not shown, such as terrestrial digital broadcasting, satellite broadcasting, CATV (Cable Television) network, the Internet, or other networks and supplies the acquired signal to the transmission path decode processing block 202.

If the signal to be acquired by the acquisition block 201 is broadcast via a broadcasting station, terrestrial wave, satellite wave, CATV network, or the like, for example, the acquisition block 201 is configured by a tuner or STB (Set Top Box), for example. If the signal to be acquired by the acquisition block 201 is transmitted in a multicast manner as with IPTV (Internet Protocol Television) from a Web server, for example, the acquisition block 201 is configured by a network interface, such as NIC (Network Interface Card), for example.

The transmission path decode processing block 202 executes transmission path decode processing at least including the processing of correcting an error caused on the transmission path on the signal acquired by the acquisition block 201 via transmission path and supplies a resultant signal to the information source decode processing block 203.

To be more specific, the signal acquired by the acquisition block 201 via transmission path is a signal obtained by at least executing error correction coding for correcting an error caused on the transmission path. So, the transmission path decode processing block 202 executes transmission path decode processing, such as error correction processing for example, on this signal.

The error correction coding includes LDPC coding and Reed-Solomon coding, for example. Here, for the error correction code, at least LDPC coding is executed.

Also, the transmission path decode processing may include the demodulation of modulated signals, for example.

The information source decode processing block 203 executes information source decode processing including at least the processing of decompressing compressed information to the original information onto the signal with the transmission path decode signal executed.

That is, the signal acquired by the acquisition block 201 via transmission path may have been executed with compression coding for compression information to reduce the amount of data i.e. image and audio data. If the signal is compressed, the information source decode processing block 203 executes information source decoding processing, such as decompression processing for decompressing the compressed information to the original information, onto the signal executed with transmission path decode processing.

It should be noted that if the signal acquired by the acquisition block 201 via transmission path is not executed with compression coding, the information source decode processing block 203 does not execute the decompression processing for decompressing the compressed information to the original information.

The decompression processing includes MPEG (Moving Picture Experts Group phase) decoding for example. The information source decode processing includes descrambling, for example, in addition to the decompression processing.

In the receiving system configured as described above, the acquisition block 201 acquires, via transmission path, a signal compressed by MPEG coding for example in image and audio data for example, this signal further being executed with error correction processing such as LDPC coding for example, and supplies the compressed and error-corrected signal to the transmission path decode processing block 202.

The transmission path decode processing block 202 executes, as transmission decode processing, the processing similar to that of the receiving apparatuses 30, 50, and 70 onto the LDPC code supplied from the acquisition block 201, for example. The signal obtained as a result of the transmission path decode processing is supplied to the information source decode processing block 203.

The information source decode processing block 203 executes information source decode processing, such as MPEG decoding, on the signal supplied from the transmission path decode processing block 202 and outputs a resultant image or audio.

The receiving system configured as described above is applicable to a television tuner for receiving television broadcasting as digital broadcasting, for example.

It should be noted that the acquisition block 201, the transmission path decode processing block 202, and the information source decode processing block 203 may be each configured as a discrete device (a hardware device such as an IC (Integrated Circuit) for example or a software module).

In addition, it is practicable to configure a set of two or all of the acquisition block 201, the transmission path decode processing block 202, and the information source decode processing block 203 as one independent apparatus. Such a set may include one composed of the acquisition block 201 and the transmission path decode processing block 202, another composed of the transmission path decode processing block 202 and the information source decode processing block 203, and still another composed of acquisition block 201 and the transmission path decode processing block 202, and the information source decode processing block 203, for example.

Figure 21:
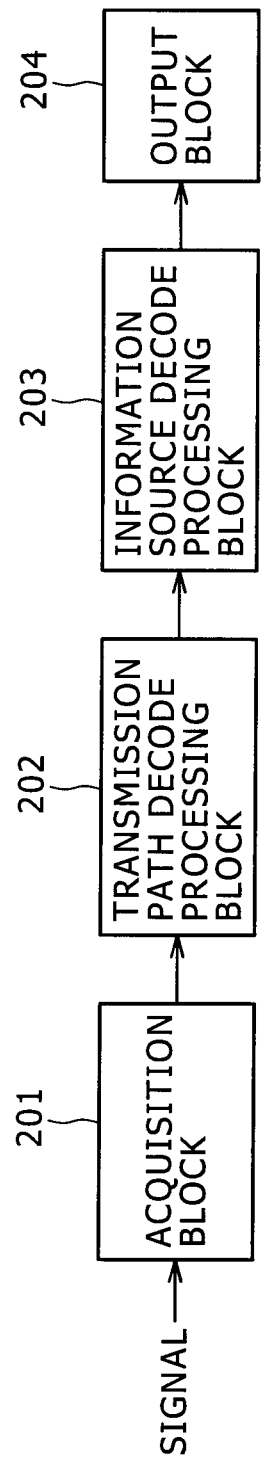
FIG. 21 is a block diagram illustrating a second exemplary configuration of a receiving system applicable to receiving apparatuses.

Referring to FIG. 21, there is shown a block diagram illustrating a second exemplary configuration of a receiving system applicable to the receiving apparatuses 30, 50, and 70 described above.

With reference to FIG. 21, components similar to those previous described with reference to FIG. 20 are denoted by the same reference numerals and the description of the duplicate components is skipped.

The receiving system shown in FIG. 21 is substantially common to the receiving system shown in FIG. 20 in having the acquisition block 201, the transmission path decode processing block 202, and information source decode processing block 203 and is different from the receiving system shown in FIG. 20 in an output block 204.

The output block 204 is a display apparatus for displaying images or a loudspeaker for sounding audio data, outputting image and audio data as a signal outputted from the information source decode processing block 203. That is, the output block 204 displays images or outputs audio data.

The receiving system shown in FIG. 21 configured as described above is applicable to television receivers for receiving television broadcasting as digital broadcasting and radio receivers for receiving radio broadcasting.

It should be noted that, if the signal acquired by the acquisition block 201 is not compressed, the signal outputted from the transmission path decode processing block 202 is supplied to the output block 204.

Figure 22:
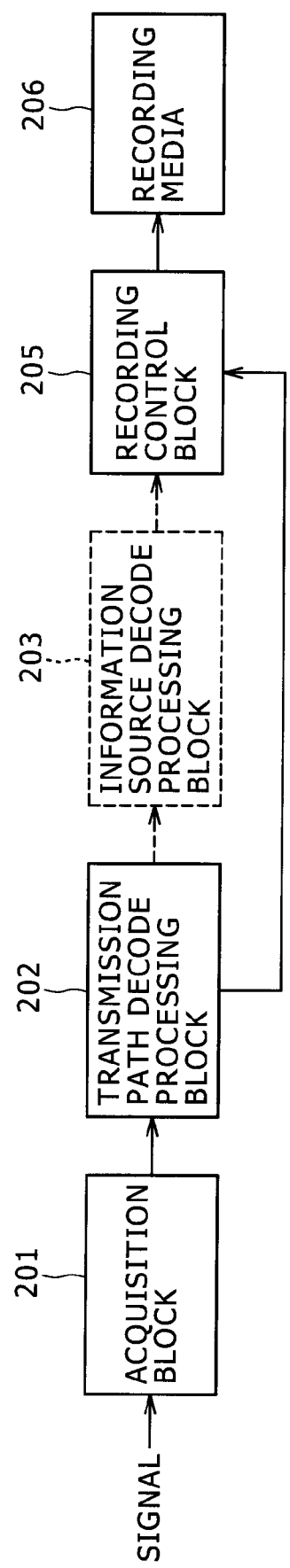
FIG. 22 is a block diagram illustrating a third exemplary configuration of a receiving system applicable to receiving apparatuses.

Referring to FIG. 22, there is shown a block diagram illustrating a third exemplary configuration of a receiving system applicable to the receiving apparatuses 30, 50, and 70 described above.

With reference to FIG. 22, components similar to those previously described with reference to FIG. 20 are denoted by the same reference numerals and the description of the duplicate components is skipped.

The receiving system shown in FIG. 22 is substantially common to the receiving system shown in FIG. 21 in having the acquisition block 201 and the transmission path decode processing block 202.

However, the receiving system shown in FIG. 22 does not have the information source decode processing block 203 but has a recording control block 205 and a recording media 206, which is a difference from the receiving system shown in FIG. 21.

The recording control block 205 controls the recording of a signal (a TS packet of MPEG TS (Transport Stream) for example) outputted from the transmission path decode processing block 202 onto the recording media 206, such as an optical disk, a hard disk (or a magnetic disk), or a flash memory.

The receiving system configured as described above is applicable to recorders and the like for recording television broadcasting.

It should be noted that, in FIG. 22, the receiving system can be configured by the information source decode processing block 203, which can make the recording control block 205 record a signal with the information source decode processing executed, namely, image and audio data obtained by decoding, onto the recording media 206.

[Application of the Present Invention to Programs]

It should be noted that above-mentioned sequence of processing operations may be executed by software as well as hardware.

Figure 23:
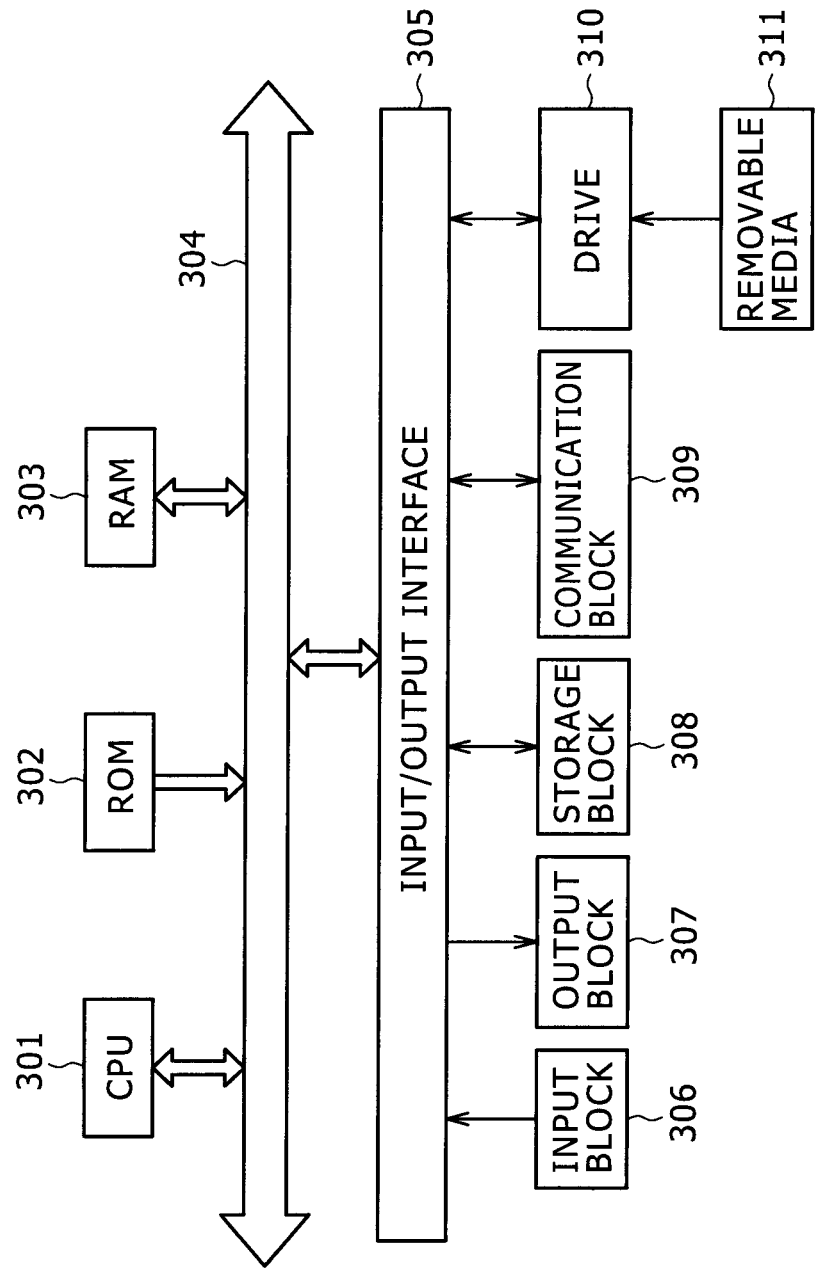
FIG. 23 is a block diagram illustrating an exemplary configuration of a computer.

In this case, a computer shown in FIG. 23 can be used for at least a part of the receiving system that includes the receiving apparatuses 30, 50, and 70 described above.

In FIG. 23, a CPU (Central Processing Unit) 301 executes various processing operations as instructed by programs recorded to a ROM (Read Only Memory) 302. The CPU 301 also executes various processing operations as instructed by programs stored in a storage block 308 and loaded into a RAM (Random Access Memory) 303. The RAM 303 also stores data and so on necessary for the CPU 301 to execute various processing operations.

The CPU 301, the ROM 302, and the RAM 303 are interconnected through a bus 304. This bus 304 is also connected with an input/output interface 305.

The input/output interface 305 is connected with an input block 306 composed of a keyboard and a mouse for example, and an output block 307 composed of a display monitor for example. The input/output interface 305 is also connected with a storage block 308 composed of a hard disk drive for example and a communication block 309 composed of a modem and a terminal adaptor for example. The communication block 309 controls communication that is executed between other apparatuses, not shown, via a network including the Internet.

The input/output interface 305 is also connected with a drive 310 as required, on which a removable media 311, such as a magnetic disk, an optical disk, a magneto-optical disk or a semiconductor device, is appropriately loaded. Then, computer programs read from the removal media 311 are installed in the storage block 308 as required.

When the above-mentioned sequence of processing operations is executed by software, the programs constituting the software are installed in a computer which is built in dedicated hardware equipment or installed, from a network or recording media, into a general-purpose personal computer for example in which various programs may be installed for the execution of various functions.

The above-mentioned recording media is configured not only by the removable media 311 such as a magnetic disk (including a floppy disk), an optical disk (including CD-ROM (Compact Disk Read Only Memory), DVD (Digital Versatile Disk), a magneto-optical disk (including MD (Mini Disk) (trademark)), or a semiconductor memory recorded with programs for distribution of programs to users separately from the apparatus main, but also by the ROM 302 recorded with programs and a hard disk drive recorded with programs and included in the storage block 308 that are provided to users as incorporated in the apparatus main as shown in FIG. 23.

It should be noted herein that the steps for describing each program recorded in recording media include not only the processing operations which are sequentially executed in a time-dependent manner but also the processing operations which are executed concurrently or discretely.

It should also be noted that term "system" as used herein denotes an entire apparatus configured by a plurality of component units.

While preferred embodiments of the present invention have been described using specific terms, such description is for illustrative purpose only, and it is to be understood that changes and variations may be made without departing from the spirit or scope of the following claims.

The present application contains subject matter related to that disclosed in Japanese Priority Patent Application JP 2009-131258 filed with the Japan Patent Office on May 29, 2009, the entire content of which is hereby incorporated by reference.

What is claimed is:

1. A receiving apparatus, comprising:
   decoding means for receiving and decoding a low density parity check code; and
   decoding control means for controlling a frequency of said decoding on the basis of conditional information that is an index indicative of a communication condition that influences power consumption in said decoding means,
   wherein said decoding means repetitively executes said decoding to output a decoding result until one of the reception of a new low density parity check code and the successful decoding of said low density parity check code is achieved; and
   wherein said decoding control means computes a free time in which said decoding is not executed on the basis of said reception interval and an output timing of said decoding result and controls a speed of said decoding on the basis of the computed free time.

2. The receiving apparatus according to claim 1, wherein said decoding control means controls the frequency of said decoding on a code word basis.

3. The receiving apparatus according to claim 1, further comprising:
   computing means for computing a bit error rate on the basis of said low density parity check code and a decoding result thereof, wherein
   said decoding control means controls said decoding frequency by use of said bit error rate computed by said computing means as said conditional information.

4. The receiving apparatus according to claim 1, wherein
   said decoding means repeats said decoding until either the reception of a new one of said low density parity check code, or successful decoding of the current low density parity check code is achieved; and
   said decoding control means uses, as said conditional information, one of a decoding count of said low density parity check code and a count in which the decoding of said low density parity check code has been unsuccessful until the reception of said new one of said low density parity check code, thereby controlling said decoding frequency.

5. The receiving apparatus according to claim 1, wherein said decoding control means uses a carrier-noise ratio of said low density parity check code as said conditional information, thereby controlling said decoding frequency.

6. The receiving apparatus according to claim 1, wherein said decoding control means changes said decoding frequency in a stepwise manner.

7. The receiving apparatus according to claim 1, wherein said decoding control means also controls a speed of said decoding on the basis of a reception interval of said low density parity check code.

8. A receiving method, comprising the steps of:
   receiving and decoding a low density parity check code; and
   controlling a frequency of said decoding on the basis of conditional information that is an index indicative of a communication condition influencing power consumption in decoding,
   wherein said receiving and decoding comprises repetitively executing said decoding to output a decoding result until one of the reception of a new low density parity check code and the successful decoding of said low density parity check code is achieved; and
   wherein said decoding controlling comprises computing a free time in which said decoding is not executed on the basis of said reception interval and an output timing of said decoding result and controls a speed of said decoding on the basis of the computed free time.

9. A non-transitory, computer-readable medium having instructions for making a computer execute processing on a received low density parity check code, comprising the steps of:
decoding a low density parity check code; and
controlling a frequency of said decoding on the basis of conditional information that is an index indicative of a communication condition influencing power consumption in decoding,
wherein decoding said low density parity check code comprises repetitively executing said decoding to output a decoding result until one of the reception of a new low density parity check code and the successful decoding of said low density parity check code is achieved; and
wherein decoding controlling a frequency comprises computing a free time in which said decoding is not executed on the basis of said reception interval and an output timing of said decoding result and controls a speed of said decoding on the basis of the computed free time.

10. A receiving system, comprising:
acquisition means for acquiring a signal from a transmission path; and
transmission path decode processing means for executing transmission path decode processing on a signal acquired by said acquisition means, wherein
said transmission path decode processing means includes
decoding means for decoding a low density parity check code of said signal; and
decoding control means for controlling a frequency of said decoding on the basis of conditional information that is an index indicative of a communication condition that influences power consumption in said decoding means,
wherein said decoding means repetitively executes said decoding to output a decoding result until one of the reception of a new low density parity check code and the successful decoding of said low density parity check code is achieved; and
wherein said decoding control means computes a free time in which said decoding is not executed on the basis of said reception interval and an output timing of said decoding result and controls a speed of said decoding on the basis of the computed free time.

11. A receiving system, comprising:
transmission path decode processing means for executing transmission path decode processing on a signal acquired from a transmission path; and
information source decode processing means for executing information source decode processing on said signal executed with the transmission path decode processing by said transmission path decode processing means, wherein
said transmission path decode processing means includes
decoding means for decoding a low density parity check code of said signal; and
decoding control means for controlling a frequency of said decoding on the basis of conditional information that is an index indicative of a communication condition that influences power consumption in said decoding means,
wherein said decoding means repetitively executes said decoding to output a decoding result until one of the reception of a new low density parity check code and the successful decoding of said low density parity check code is achieved; and
wherein said decoding control means computes a free time in which said decoding is not executed on the basis of said reception interval and an output timing of said decoding result and controls a speed of said decoding on the basis of the computed free time.

12. A receiving system, comprising:
transmission path decode processing means for executing transmission path decode processing on a signal acquired from a transmission path; and
output means for outputting at least one of image data and audio data on the basis of said signal executed with the transmission path decode processing by said transmission path decode processing means, wherein
said transmission path decode processing means includes
decoding means for decoding a low density parity check code of said signal; and
decoding control means for controlling a frequency of said decoding on the basis of conditional information that is an index indicative of a communication condition that influences power consumption in said decoding means,
wherein said decoding means repetitively executes said decoding to output a decoding result until one of the reception of a new low density parity check code and the successful decoding of said low density parity check code is achieved; and
wherein said decoding control means computes a free time in which said decoding is not executed on the basis of said reception interval and an output timing of said decoding result and controls a speed of said decoding on the basis of the computed free time.

13. A receiving system, comprising:
transmission path decode processing means for executing transmission path decode processing on a signal acquired from a transmission path; and
recording control means for controlling recording of said signal executed with the transmission path decode processing by said transmission path decode processing means, wherein
said transmission path decode processing means includes
decoding means for decoding a low density parity check code of said signal; and
decoding control means for controlling a frequency of said decoding on the basis of conditional information that is an index indicative of a communication condition that influences power consumption in said decoding means,
wherein said decoding means repetitively executes said decoding to output a decoding result until one of the reception of a new low density parity check code and the successful decoding of said low density parity check code is achieved; and
wherein said decoding control means computes a free time in which said decoding is not executed on the basis of said reception interval and an output timing of said decoding result and controls a speed of said decoding on the basis of the computed free time.

14. A receiving apparatus, comprising:
a decoding section configured to receive and decode an low density parity check code; and
a decoding control section configured to control a frequency of said decoding on the basis of conditional information that is an index indicative of a communication condition that influences power consumption in said decoding section,
wherein said decoding section is configured to repetitively execute said decoding to output a decoding result until one of the reception of a new low density parity check code and the successful decoding of said low density parity check code is achieved; and wherein said decoding control section is configured to compute a free time in which said decoding is not executed on the basis of said reception interval and an output timing of said decoding result and controls a speed of said decoding on the basis of the computed free time.

* * * * *